US012599983B2

(12) United States Patent
Wang et al.

(10) Patent No.: US 12,599,983 B2
(45) Date of Patent: Apr. 14, 2026

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Yu-Young Wang, New Taipei City (TW); Chun-Min Lin, Hsinchu City (TW); Min-Yu Wu, Hsinchu City (TW); Chih-Jen Wu, Chu-Dong Town (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/410,435

(22) Filed: Jan. 11, 2024

(65) Prior Publication Data

US 2025/0087625 A1     Mar. 13, 2025

Related U.S. Application Data

(60) Provisional application No. 63/581,793, filed on Sep. 11, 2023.

(51) Int. Cl.
  B23K 1/00       (2006.01)
  B23K 1/012      (2006.01)
        (Continued)

(52) U.S. Cl.
  CPC ............ H01L 24/75 (2013.01); B23K 1/0016 (2013.01); B23K 1/012 (2013.01); B23K 3/04 (2013.01);
        (Continued)

(58) Field of Classification Search
  CPC ........ B23K 1/012; B23K 1/008; B23K 3/085; B23K 3/04
  See application file for complete search history.

(56) References Cited

U.S. PATENT DOCUMENTS

| | | | | | |
|---|---|---|---|---|---|
| 2,630,760 | A | * | 3/1953 | Ryba ..................... | F04B 43/028 417/413.1 |
| 3,126,701 | A | * | 3/1964 | Henderson et al. ..... | C06D 5/00 60/252 |

(Continued)

FOREIGN PATENT DOCUMENTS

| | | |
|---|---|---|
| CN | 113695703 B | 7/2022 |
| TW | 201138579 A | 11/2011 |

*Primary Examiner* — Erin B Saad
(74) *Attorney, Agent, or Firm* — Harrity & Harrity, LLP

(57)         ABSTRACT

A zone heater assembly of a reflow solder tool includes a gas deflector having a single-layer structure. The single-layer structure may include one or more gas-permeating patterns through which a process gas is to flow from one or more gas outlets to a gas exhaust of the zone heater assembly. The one or more gas-permeating patterns in the single-layer structure promote uniformity of gas flow through the gas exhaust and into a heating zone of the reflow solder tool. The uniformity of the gas flow of the process gas enables convection heat provided by the process gas to be uniformly distributed across the heating zone. In this way, the gas deflector described herein may decrease hot spots and/or cold spots in the heating zone, which enables greater flexibility in placement of semiconductor package substrates on a conveyor device of the reflow solder tool.

20 Claims, 11 Drawing Sheets

(51) Int. Cl.

| | |
|---|---|
| *B23K 3/00* | (2006.01) |
| *B23K 3/04* | (2006.01) |
| *B23K 3/08* | (2006.01) |
| *H01L 23/00* | (2006.01) |
| *B23K 101/40* | (2006.01) |

(52) U.S. Cl.

CPC ............... *B23K 3/08* (2013.01); *H01L 24/81* (2013.01); *B23K 2101/40* (2018.08); *H01L 2224/75272* (2013.01); *H01L 2224/75651* (2013.01); *H01L 2224/7598* (2013.01); *H01L 2224/8121* (2013.01); *H01L 2224/81815* (2013.01)

(56) References Cited

U.S. PATENT DOCUMENTS

| | | | | |
|---|---|---|---|---|
| 8,011,293 | B2 * | 9/2011 | McFadden | A21B 1/24 |
| | | | | 219/400 |
| 8,113,190 | B2 * | 2/2012 | Dougherty | A21B 1/48 |
| | | | | 219/684 |
| 9,511,379 | B2 * | 12/2016 | Hiyama | B23K 1/0016 |
| 9,748,199 | B2 * | 8/2017 | Dhavaleswarapu | B23K 3/08 |
| D934,631 | S * | 11/2021 | Anthony | D7/409 |
| D940,503 | S * | 1/2022 | Guerin | D7/354 |
| D941,090 | S * | 1/2022 | Guerin | D7/354 |
| 11,311,956 | B2 | 4/2022 | Soma | |
| D1,042,009 | S * | 9/2024 | Biegeleisen | A47J 27/00 |
| | | | | D7/362 |
| 2002/0100791 | A1 * | 8/2002 | Mukuno | B23K 1/012 |
| | | | | 228/49.5 |
| 2004/0206729 | A1 * | 10/2004 | Shinohara | H01J 37/32192 |
| | | | | 219/121.43 |
| 2008/0206420 | A1 * | 8/2008 | McFadden | A23L 5/17 |
| | | | | 219/385 |
| 2008/0216812 | A1 * | 9/2008 | Dougherty | A21B 1/48 |
| | | | | 99/443 R |
| 2011/0308435 | A1 * | 12/2011 | Moreno Rueda | F23J 1/02 |
| | | | | 110/165 R |
| 2012/0178039 | A1 * | 7/2012 | Kagaya | B23K 3/08 |
| | | | | 165/177 |
| 2013/0186946 | A1 | 7/2013 | Beair et al. | |
| 2014/0252607 | A1 * | 9/2014 | Miyauchi | B23K 35/302 |
| | | | | 228/111.5 |
| 2015/0343460 | A1 * | 12/2015 | Hiyama | B23K 1/012 |
| | | | | 239/556 |
| 2023/0256530 | A1 * | 8/2023 | Bornegård | B23K 1/0012 |
| | | | | 228/183 |

* cited by examiner

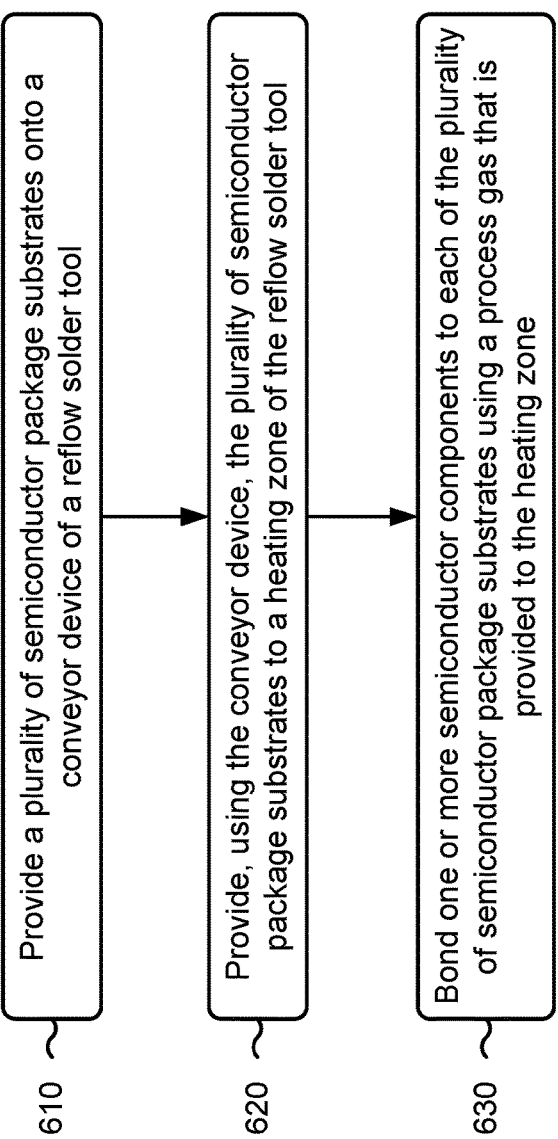

600

610   Provide a plurality of semiconductor package substrates onto a conveyor device of a reflow solder tool 620   Provide, using the conveyor device, the plurality of semiconductor package substrates to a heating zone of the reflow solder tool 630   Bond one or more semiconductor components to each of the plurality of semiconductor package substrates using a process gas that is provided to the heating zone

FIG. 6

SEMICONDUCTOR PROCESSING TOOL AND METHODS OF OPERATION

CROSS-REFERENCE TO RELATED APPLICATION

This patent application claims priority to U.S. Provisional Patent Application No. 63/581,793, filed on Sep. 11, 2023, and entitled "SEMICONDUCTOR PROCESSING TOOL AND METHODS OF OPERATION." The disclosure of the prior application is considered part of and is incorporated by reference into this patent application.

BACKGROUND

A reflow solder tool is a type of semiconductor processing tool that is used in the semiconductor industry. A reflow solder tool may be used to solder components, such as semiconductor dies and/or semiconductor die packages, onto a semiconductor package substrate to form a semiconductor device package. Semiconductor package substrates, along with the components placed on the semiconductor package substrates, are positioned on a conveyor device that moves the semiconductor package substrates through a plurality of heating zones of the reflow solder tool. Each heating zone is configured to provide convection heat onto the semiconductor package substrates at a particular temperature so that a temperature profile for a reflow soldering operation for the semiconductor package substrates can be achieved. The reflow soldering operation is performed to reflow a solder paste between a semiconductor package substrate and the components on the semiconductor package substrate, which forms solder joints that bond the components to the semiconductor package substrate to form a semiconductor device package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flowchart of an example process associated with a solder reflow operation described herein.

DETAILED DESCRIPTION

Figure 1A:
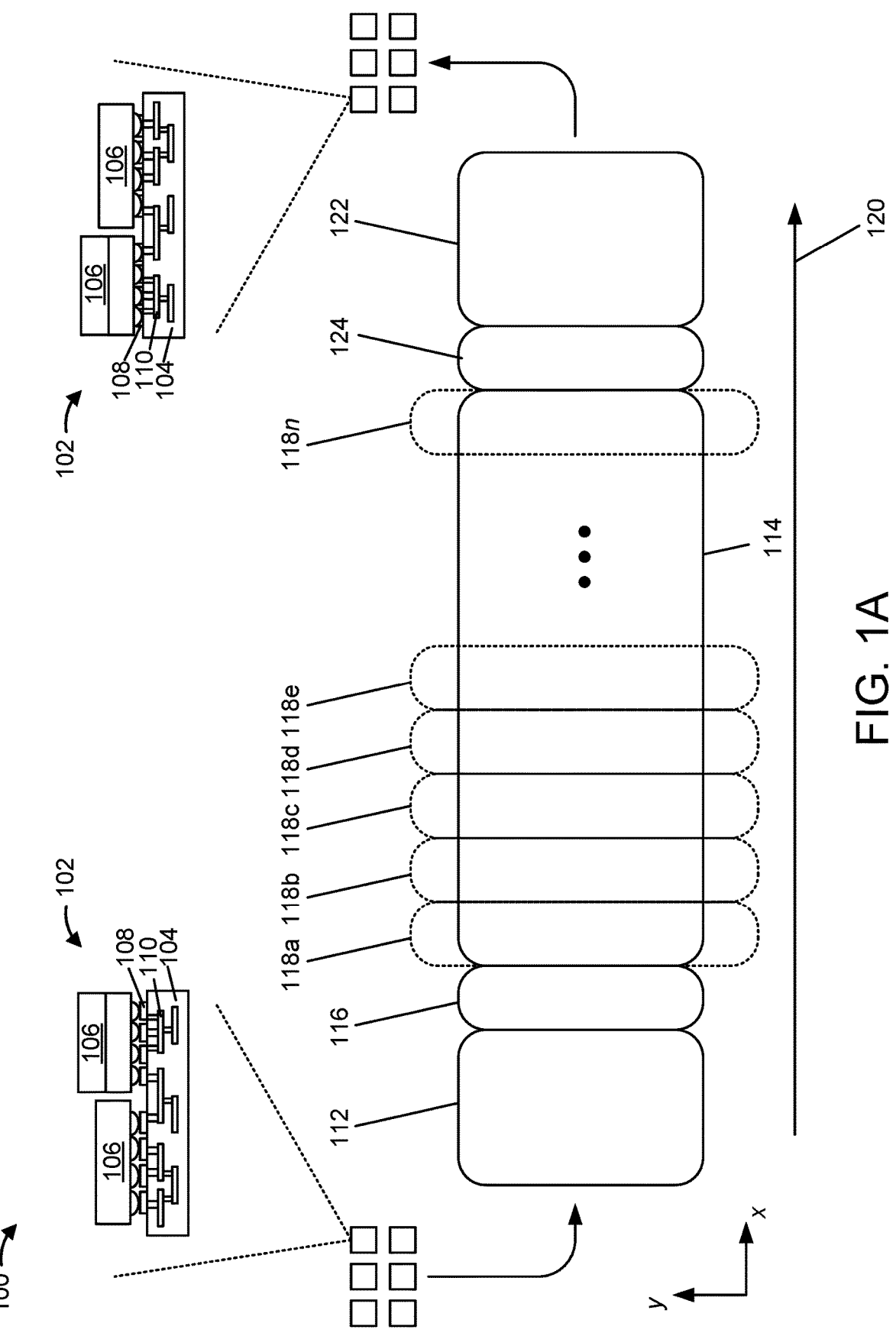
FIGS. 1A and 1B are diagrams of an example semiconductor processing tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Convection heat in a heating zone of a reflow solder tool may be provided in the form of a process gas that is generated by a zone heater assembly associated with the heating zone. The zone heater assembly is used to generate the process gas by heating one or more inlet gasses. The zone heater assembly is used to provide the process gas onto semiconductor package substrates by blowing the process gas through plumbing in the zone heater assembly using a blower fan as the semiconductor package substrates pass through the heating zone.

Gas flow uniformity of the process gas and/or temperature uniformity of the heating zone are some of the parameters that directly affect the throughput of the reflow solder tool and/or the quality of the solder joints that bond the components to the semiconductor package substrates. Variation in gas flow of the process gas may result in hot spots and/or cold spots in the heating zone, resulting in limited placement of semiconductor package substrates on the conveyor device. The limited placement of semiconductor package substrates on the conveyor device means that fewer semiconductor package substrates can be processed than if a greater area of the conveyor device were able to be utilized. This results in reduced unit throughput per hour (UPH) for the reflow solder tool. Additionally and/or alternatively, variation in temperature in the heating zone (e.g., variation of the temperature across the area of the heating zone and/or variation in the temperature of the process gas) may lead to insufficient convection heat being supplied to sufficiently reflow the solder paste. The insufficient convection heat may result in reduced quality (e.g., reduced solder strength, reduced solder coverage) of the solder joints that bond the components to the semiconductor package substrates, which may increase the likelihood that the solder joints will fail. This may result in an increased failure rate in the bonds between the components on the semiconductor package substrates, which may reduce the yield of semiconductor device packages produced by the reflow solder tool.

In some implementations described herein, a zone heater assembly of a reflow solder tool includes a gas deflector having a single-layer structure. The single-layer structure may include one or more gas-permeating patterns through which a process gas is to flow from one or more gas outlets to a gas exhaust of the zone heater assembly. The one or more gas-permeating patterns in the single-layer structure promote uniformity of gas flow through the gas exhaust and into a heating zone of the reflow solder tool. The uniformity of the gas flow of the process gas enables convection heat provided by the process gas to be uniformly distributed across the heating zone. In this way, the gas deflector described herein may decrease hot spots and/or cold spots in the heating zone, which enables greater flexibility in placement of semiconductor package substrates on a conveyor device of the reflow solder tool. This enables a greater quantity and/or rate of semiconductor package substrates to be processed using the reflow solder tool than without the gas deflector, which increases the productivity (e.g., the UPH) of the reflow solder tool. Moreover, the increased temperature uniformity in the heating zone increases the likelihood that sufficient convection heat is provided to the semiconductor package substrates on the conveyor device to form high-quality solder joints between the semiconductor package substrates and the components bonded to the semiconductor package substrates. This decreases the likelihood that the solder joints will fail, which may result in a reduced failure rate in the bonds between the components on the semiconductor package substrates, and/or may increase the yield of semiconductor device packages produced by the reflow solder tool.

Figure 1B:
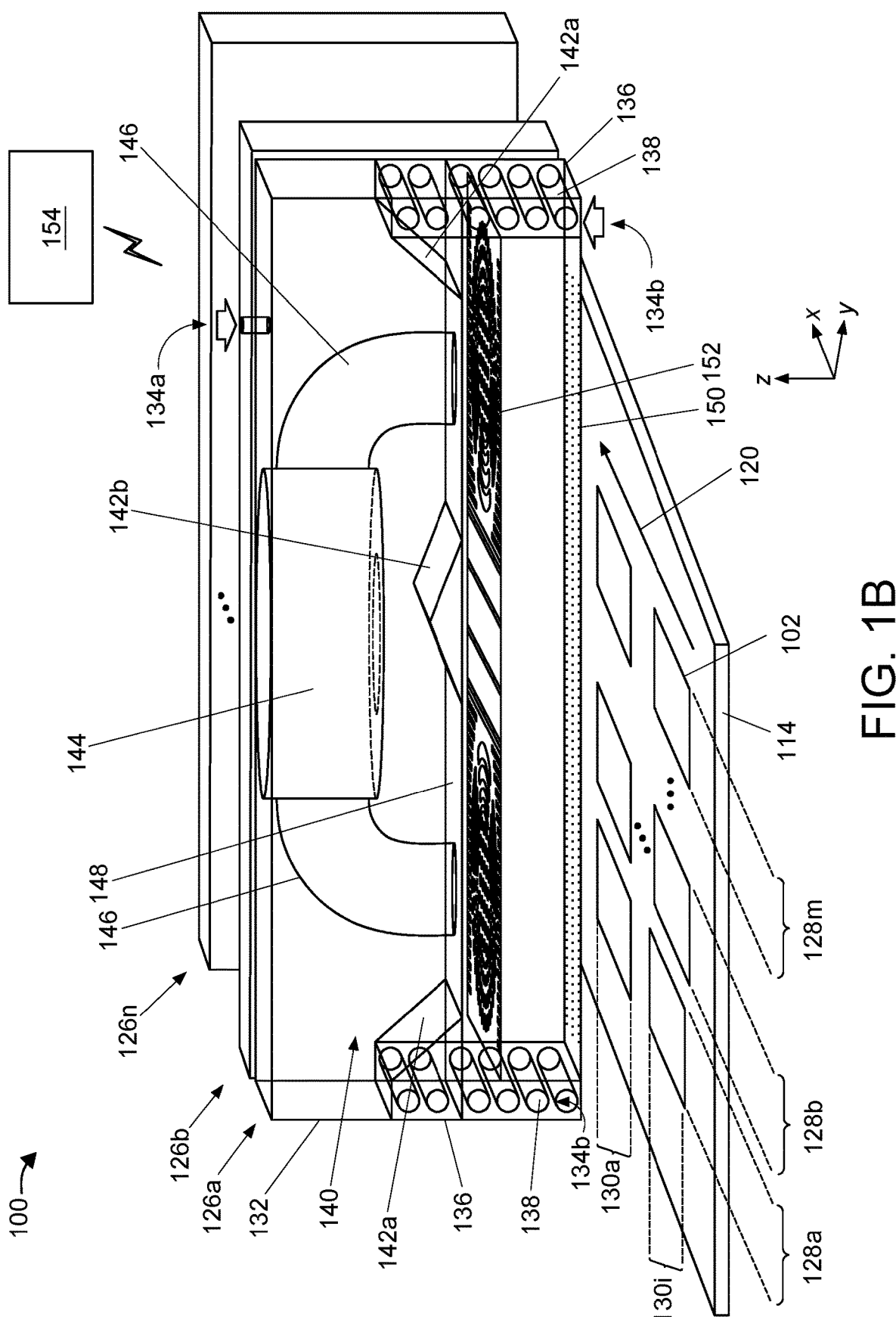

FIGS. 1A and 1B are diagrams of an example semiconductor processing tool described herein. The semiconductor processing tool includes a reflow solder tool and/or another type of semiconductor processing tool that is used to solder components, such as semiconductor dies and/or semiconductor die packages, onto a semiconductor package substrate to form a semiconductor device package.

FIG. 1A illustrates a top-down view of the semiconductor processing tool 100. As shown in FIG. 1A, the semiconductor processing tool 100 is used to process semiconductor device packages 102. A semiconductor device package 102 includes a semiconductor package substrate 104 and one or more semiconductor components 106 that are to be attached to the semiconductor package substrate. In some implementations, a semiconductor component 106 includes a logic die such as a central processing unit (CPU) die, a mobile application processor die, an application-specific integrated circuit (ASIC) die, a graphics processing unit (GPU) die, a field programmable gate array (FPGA) die, and/or a microcontroller die, among other examples. In some implementations, a semiconductor component 106 includes a memory die such as a dynamic random access memory (DRAM) die, a NAND die, a static random access memory (SRAM) die, and/or a high bandwidth memory (HBM) die, among other examples. In some implementations, a semiconductor component 106 includes a high data rate transceiver die, an I/O interface die, an image sensor die, an integrated passive device (IPD) die, and/or a radio frequency (RF) die, among other examples.

In some implementations, the semiconductor components 106 of a semiconductor device package 102 are chiplets, which is a type of semiconductor die that includes a specific subset of functionalities of the semiconductor device package 102. For example, an RF front-end device may include a plurality of chiplets that are packaged on a semiconductor package substrate. A chiplet may correspond to a power amplifier die, a filter die, an RF switch die, an antenna switch die, and/or an antenna tuner die, among other examples. As another example, a CPU device may include a plurality of processor core chiplets, a plurality HBM chiplets, and one or more I/O interface chiplets. Implementing chiplets on a semiconductor package substrate 104 (e.g., as opposed to a monolithic die that includes the entire suite of functionalities) enables advancements to be realized for specific functionalities without having to necessarily redesign semiconductor dies for other functionalities.

The semiconductor components 106 of a semiconductor device package 102 may be electrically connected through redistribution layers 110 in the semiconductor package substrate 104, and/or may be stacked in a system on integrated chip (SoIC) manner such that two or more semiconductor components 106 are directly bonded and interconnected. The semiconductor components 106 may be positioned on solder pads 108 on the semiconductor package substrate 104. The solder pads 108 include reflowable solder paste that, when processed by the semiconductor processing tool 100, secure the semiconductor components 106 to the semiconductor package substrate 104.

As further shown in FIG. 1A, the semiconductor processing tool 100 includes a load port 112 in which semiconductor device packages 102 are staged prior to processing. The semiconductor device packages 102 may be transferred to the load port 112 by a transport tool, such as a mobile robot, a robot arm, a tram or rail car, an overhead hoist transport (OHT) system, an automated material handling system (AMHS), and/or another type of device that is configured to transport semiconductor device packages 102. In some implementations, the semiconductor components 106 may be placed onto the semiconductor package substrates 104 of the semiconductor device packages 102 in the load port 112. For example, a pick-and-place tool may place the semiconductor components 106 onto the semiconductor package substrates 104 of the semiconductor device packages 102 in the load port 112. Additionally and/or alternatively, the pick and place tool may place the semiconductor components 106 onto the semiconductor package substrates 104 of the semiconductor device packages 102 prior to the semiconductor device packages 102 being loaded into the load port 112.

As further shown in FIG. 1A, the semiconductor processing tool 100 includes a conveyor device 114 and a buffer zone 116 between the load port 112 and the conveyor device 114. The conveyor device 114 includes a conveyor belt, a movable platform, a pallet system that includes a plurality of connected plates, and/or another type of device that is configured to move the semiconductor device packages 102 through a plurality of heating zones 118a-118n. The semiconductor device packages 102 on the conveyor device 114 are exposed to heat as the conveyor device 114 moves the semiconductor device packages 102 through the heating zones 118a-118n.

Convection heat is provided onto the semiconductor device packages 102 in each of the heating zones 118a-118n at a particular temperature so that a temperature profile for a reflow soldering operation for the semiconductor device packages 102 can be achieved. For example, convection heat may be provided onto the semiconductor device packages 102 in the heating zones 118a-118n at increasing temperatures in a direction of travel 120 (e.g., in the x-direction) of the semiconductor device packages 102 on the conveyor device 114. Thus, convection heat may be provided onto the semiconductor device packages 102 at a first temperature in the heating zone 118a, convection heat may be provided onto the semiconductor device packages 102 at a second temperature in the heating zone 118b that is greater than the first temperature, convection heat may be provided onto the semiconductor device packages 102 at a third temperature in the heating zone 118c that is greater than the second temperature, and so on.

As another example, the temperature of convection heat may be maintained across two or more of the heating zones

118a-118n. As another example, the temperature of convection heat provided in a heating zone may be less than the temperature of convection heat provided in a previous heating zone.

The reflow soldering operation is performed to reflow the solder paste of the solder pads 108 between the semiconductor package substrates 104 and the semiconductor components 106 on the semiconductor package substrates 104. Reflowing the solder paste removes flux from the solder paste, leaving behind solder that forms solder joints that bond the semiconductor components 106 to the semiconductor package substrates 104 of the semiconductor device packages 102.

Once the semiconductor device packages 102 are processed through the heating zones 118a-118n, the semiconductor device packages 102 are provided to an unload port 122 of the semiconductor processing tool 100 through another buffer zone 124 of the semiconductor processing tool 100. A transport tool may transfer the semiconductor device packages 102 from the unload port 122 to another semiconductor processing tool, to a storage location in a semiconductor processing facility, and/or to packaging for transport to another facility, among other examples.

FIG. 1B illustrates a perspective view of a portion of the semiconductor processing tool 100. As shown in FIG. 1B, the semiconductor processing tool 100 includes a plurality of zone heater assemblies 126a-126n. Each zone heater assembly 126a-126n is configured to provide convection heat to a respective heating zone 118a-118n. For example, a zone heater assembly 126a may be configured to provide convection heat to the heating zone 118a, the zone heater assembly 126b may be configured to provide convection heat to the heating zone 118b, and so on. The zone heater assemblies 126a-126n may be located above the conveyor device 114 and spaced apart from the conveyor device 114 such that the semiconductor device packages 102 may traverse along the conveyor device 114 under the zone heater assemblies 126a-126n.

As further shown in FIG. 1B, the semiconductor device packages 102 may be arranged in a plurality of columns 128a-128m and a plurality of rows 130a-130i on the conveyor device 114. The semiconductor device packages 102 may be placed on the conveyor device 114 (e.g., using a transport tool) in the plurality of columns 128a-128m such that a plurality of semiconductor device packages 102 in the same row are processed by a zone heater assembly at the same time. For example, the row 130a of semiconductor device packages 102 may be processed by the zone heater assembly 126a at the same time, may be processed by the zone heater assembly 126b at the same time, and so on, as the row 130a of semiconductor device packages 102 is moved through the zone heater assemblies 126a-126n using the conveyor device 114. This increases the throughput and UPH capacity of the semiconductor processing tool 100, relative to processing only a single semiconductor device package 102 at a time.

FIG. 1B further illustrates a detailed view of a heater assembly 126a. Other heater assemblies of the zone heater assemblies 126a-126n may have a similar configuration of components. As shown in FIG. 1B, the zone heater assembly 126a includes a processing chamber 132 and a plurality of components in the processing chamber 132. The processing chamber 132 includes one or more inert gas inlets 134a and one or more ambient gas inlets 134b. An inert gas, such as nitrogen ($N_2$) or argon (Ar), among other examples, may be provided into the processing chamber 132 through the one or more inert gas inlets 134a. Ambient gas (e.g., ambient air)

from around the semiconductor processing tool may be provided into the processing chamber 132 through heater devices 136 that each include a plurality of heating elements 138. The heating elements 138 in the heater devices 136 may heat (e.g., may increase the temperature of) the ambient gas as the ambient gas passes through the heater devices 136 from the ambient gas inlets 134b to a mixing chamber 140 within the processing chamber 132. The heating elements 138 may include resistive heating elements and/or another type of conductive heating elements, among other examples.

The heated ambient gas and the inert gas are mixed in the mixing chamber 140 to form a process gas. One or more gas deflector shelves 142a and/or 142b are included in the mixing chamber 140 to promote mixing of the heated ambient gas and the inert gas, and to direct the process gas upward into a gas blower device 144. Single-sided gas deflector shelves 142a may be located at opposing ends of the mixing chamber 140, and may be positioned to promote the flow of gasses in the mixing chamber 140 toward a center of the mixing chamber 140 where a double-sided gas deflector shelf 142b is located. The double-sided gas deflector shelf 142b may be positioned to promote the flow of the process gas upward into the gas blower device 144.

The gas blower device 144 includes a chamber and a fan configured to generate negative pressure in the mixing chamber 140. The negative pressure promotes the flow of the process gas upward into the chamber of the gas blower device 144. The fan is also configured to direct the process gas into one or more gas outlets 146, which may include plumbing (e.g., pipes, tubes, ducts) that are shaped to direct the flow of the process gas downward through a divider plate 148 that separates the mixing chamber 140 and a gas exhaust 150 of the processing chamber 132. The process gas flows from the one or more gas outlets 146 and to the gas exhaust 150 through a gas deflector 152. The process gas flows through the gas exhaust 150 and onto the semiconductor device packages 102 passing under the zone heater assembly 126a, which reflows the solder paste on the solder pads 108 of the semiconductor device packages 102 and bonds the semiconductor components 106 to the semiconductor package substrates 104 of the semiconductor device packages 102.

The gas deflector 152 is included between the one or more gas outlets 146 and the gas exhaust 150 (and between the gas deflector shelves 142a/142b and the gas exhaust 150) to uniformly distribute the flow of the process gas across the heating zone associated with the zone heater assembly 126a. Thus, the gas deflector 152 promotes a uniform distribution of heat and gas flow velocity of the process gas across the heating zone associated with the zone heater assembly 126a, which enables rows 130a-130i of multiple semiconductor device packages 102 to be processed at the same time through the heating zone associated with the zone heater assembly 126a, as opposed to processing a single semiconductor device package 102 at a time.

The semiconductor processing tool 100 may further include a controller 154. The controller 154 may be configured to provide signals to and/or receive signals from the load port 112, the conveyor device 114, the zone heater assemblies 126a-126n, the unload port 122, one or more transport tools associated with the semiconductor processing tool 100, and/or another device associated with or included in the semiconductor processing tool 100. The signal(s) may include electrical signals (e.g., a current, a voltage, a radio frequency (RF) signal, a digital signal, an analog signal, a digital communication), optical signal(s) (e.g., an optical communication signal), and/or another type of electromagnetic signal(s). The controller 154 may include a processor, a microprocessor, a CPU, a microcontroller, and/or another type of processor that is implemented in hardware, firmware, or a combination of hardware and software. In some implementations, the controller 154 may include one or more processors capable of being programmed to perform one or more operations or processes described elsewhere herein.

As indicated above, FIGS. 1A and 1B are provided as an example. Other examples may differ from what is described with regard to FIGS. 1A and 1B.

Figure 2A:
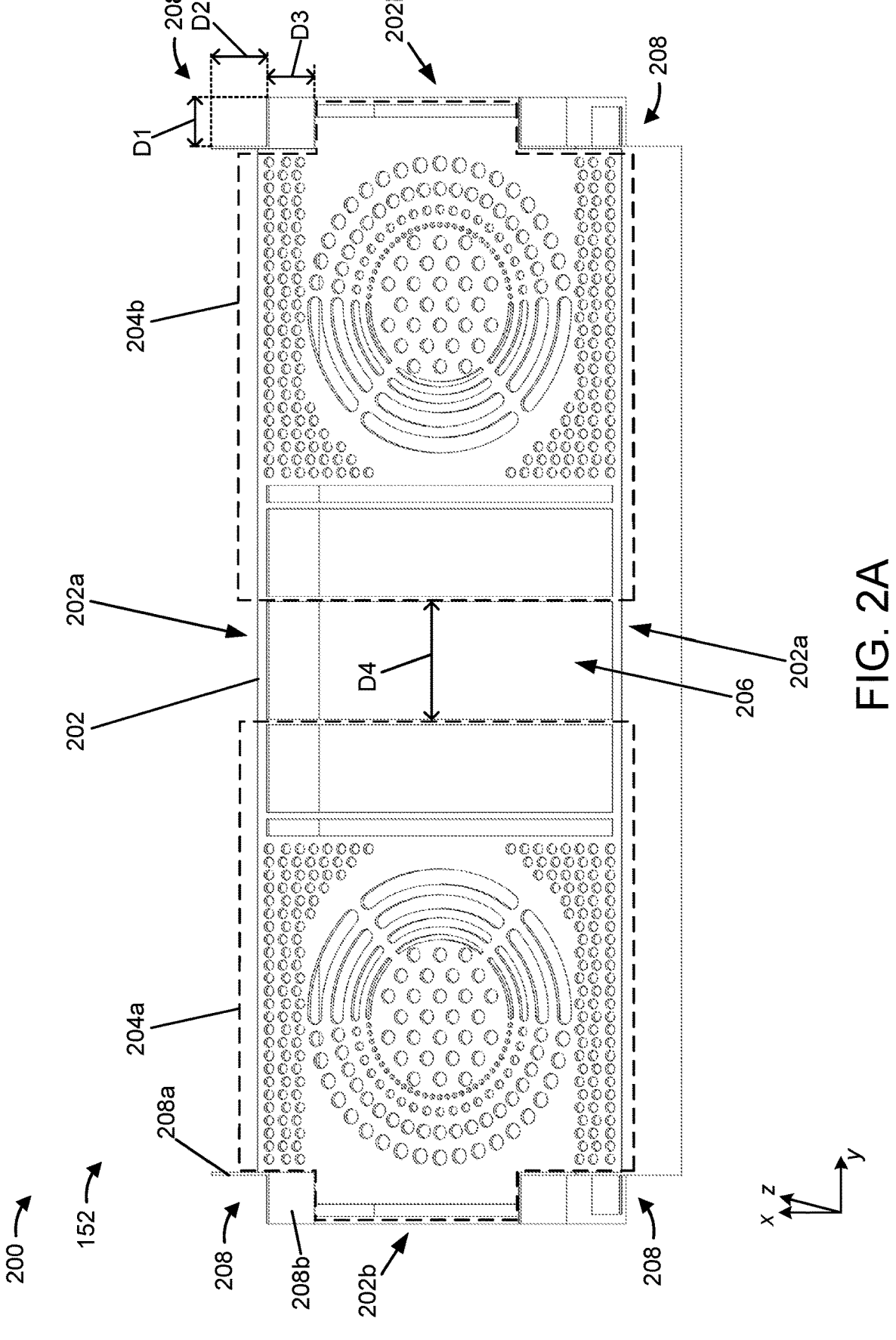
FIGS. 2A and 2B are diagrams of an example gas deflector described herein for use in the semiconductor processing tool of FIGS. 1A and 1B.
Figure 2B:
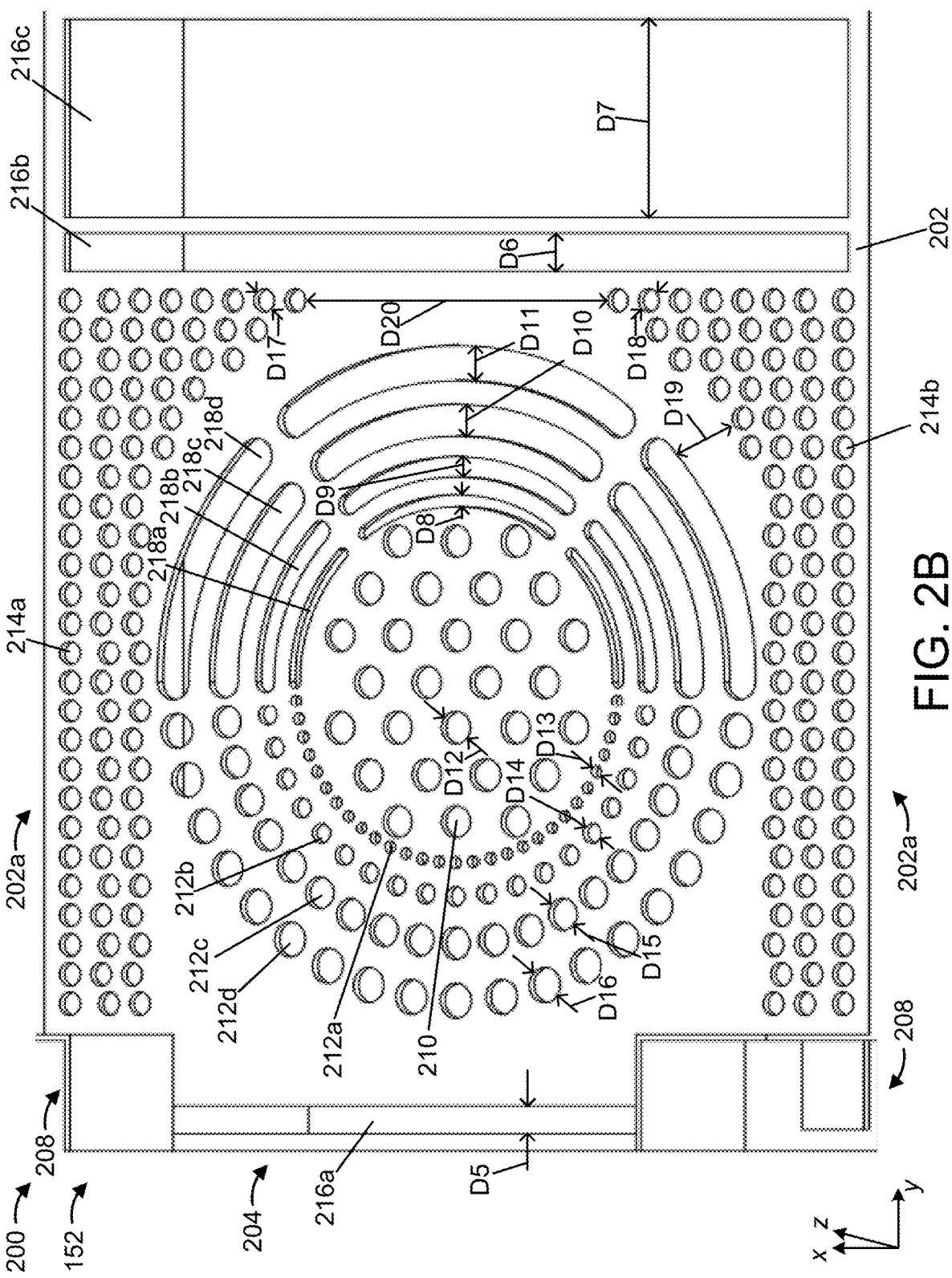

FIGS. 2A and 2B are diagrams of an example 200 of a gas deflector 152 described herein for use in the semiconductor processing tool 100 of FIGS. 1A and 1B. As shown in FIG. 2A, the gas deflector 152 includes a single-layer plate 202 that extends in an x-y plane of the gas deflector 152. The single-layer plate 202 includes sides 202a extending in a y-direction and ends 202b extending in an x-direction.

The single-layer plate 202 includes a single layer of material (e.g., aluminum, steel, titanium) that is capable of withstanding degradation over repeated exposure to the heat of a process gas that is generated by a zone heater assembly 126a-126n in which the gas deflector 152 is included. The single layer of the single-layer plate 202 is substantially flat and does not extend in the z-direction. The flat single-layer plate 202 enables the process to be evenly and uniformly distributed across the x-y plane, in that the single-layer plate 202 lacks z-direction protrusions that might otherwise interfere with the distribution of the process gas across the x-y plane of the gas deflector 152. The single-layer plate 202 may have an approximately rectangular shape in a top view of the gas deflector 152 (e.g., in the x-y plane). In some implementations, the gas deflector 152 includes notches in the corners of the single-layer plate 202.

As further shown in FIG. 2A, the single-layer plate 202 of the gas deflector 152 includes one or more gas-permeating patterns, including a gas-permeating pattern 204a and/or a gas-permeating pattern 204b. The gas-permeating patterns 204a and/or 204b enable the process gas of the associated zone heater assembly 126 to flow through the gas deflector 152 from the one or more gas outlets 146 of the zone heater assembly 126 to the gas exhaust 150 of the zone heater assembly 126. The gas-permeating patterns 204a and/or 204b are configured to promote a uniform distribution of gas flow velocity and temperature of the process gas across a heating zone 118 associated with the zone heater assembly 126. One or more slots 206 may be included between the gas-permeating patterns 204a and 204b in the single-layer plate 202. The one or more slots 206 may be located approximately at a center of the single-layer plate 202. The one or more slots 206 may be approximately rectangular in shape and may have approximately orthogonal or right-angled corners in a top view of the single-layer plate 202. The one or more slots 206 may fully extend between the sides 202a of the single-layer plate 202 such that the ends of the one or more slots 206 are approximately orthogonal to the sides 202a of the single-layer plate.

The gas deflector 152 further includes a plurality of L-shaped barrier plates 208 that are attached to the single-layer plate 202. The L-shaped barrier plates 208 are located at respective corners of the single-layer plate 202. The L-shaped barrier plates 208 are included to reduce, minimize, and/or prevent leakage of the process gas around the gas-permeating patterns 204a and/or 204b. Such leakage might otherwise reduce the uniformity of gas flow velocity distribution and/or temperature distribution of the process gas across the single-layer plate 202.

An L-shaped barrier plate 208 includes a first segment 208a extending in the x-direction, and a second segment 208b extending in the y-direction. The first segment 208a and the second segment 208b are approximately orthogonal and form an L-shaped structure. The L-shaped structure may be concave in that the L-shape structure extends into notches in the corners of the single-layer plate 202 of the gas deflector 152. Alternatively, one or more of the L-shaped barrier plates 208 may include convex L-shaped structures that conform to the corners of the single-layer plate 202 such that the single-layer plate 202 is not notched in the corners of the single-layer plate 202.

The first segment 208a of an L-shaped barrier plate 208 may have a length (indicated in FIG. 2A as dimension D1) that is included in a range of greater than 0 millimeters (mm) to approximately 27 mm. If the length of the first segment 208a is 0 mm, the first segment 208a does not block leakage of the process gas around the gas deflector 152. If the length of the first segment 208a is greater than approximately 27 mm, the L-shaped barrier plates 208 may occupy too large of an area and may not provide sufficient area on the single-layer plate 202 for the gas-permeating patterns 204a and/or 204b. This may lead to reduced uniformity of gas flow velocity distribution and/or temperature distribution of the process gas across the single-layer plate 202. If the length of the first segment 208a is included in a range of greater than 0 mm to approximately 27 mm, sufficient area on the single-layer plate 202 may be provided for the gas-permeating patterns 204a and/or 204b while enabling the L-shaped barrier plates 208 to sufficiently block leakage of the process gas around the gas deflector 152. However, other values for the length of the first segment 208a, and ranges other than greater than 0 mm to approximately 27 mm are within the scope of the present disclosure.

The second segment 208b of an L-shaped barrier plate 208 may have a length (indicated in FIG. 2A as dimension D2) that is included in a range of greater than 0 mm to approximately 27 mm. If the length of the second segment 208b is 0 mm, the second segment 208b does not block leakage of the process gas around the gas deflector 152. If the length of the second segment 208b is greater than approximately 27 mm, the L-shaped barrier plates 208 may occupy too large of an area and may not provide sufficient area on the single-layer plate 202 for the gas-permeating patterns 204a and/or 204b. This may lead to reduced uniformity of gas flow velocity distribution and/or temperature distribution of the process gas across the single-layer plate 202. If the length of the second segment 208b is included in a range of greater than 0 mm to approximately 27 mm, sufficient area on the single-layer plate 202 may be provided for the gas-permeating patterns 204a and/or 204b while enabling the L-shaped barrier plates 208 to sufficiently block leakage of the process gas around the gas deflector 152. However, other values for the length of the second segment 208b, and ranges other than greater than 0 mm to approximately 27 mm are within the scope of the present disclosure.

The L-shaped barrier plates 208 also extend in the z-direction, which is approximately orthogonal to the x-y plane in which the single-layer plate 202 of the gas deflector 152 is located. The L-shaped barrier plates 208 may extend from the single-layer plate 202 to a z-direction height (indicated in FIG. 2A as dimension D3) that is included in a range of approximately 20 mm to approximately 65 mm. If the z-direction height of the L-shaped barrier plates 208 is less than approximately 20 mm, the L-shaped barrier plates 208 may not effectively block leakage of a process gas over the L-shaped barrier plates 208. If the z-direction height of the L-shaped barrier plates 208 is greater than approximately 65 mm, the gas deflector 152 may not fit in a zone heater assembly 126 between the divider plate 148 and the gas exhaust 150 of the zone heater assembly 126. If the z-direction height of the L-shaped barrier plates 208 is included in the range of approximately 20 mm to approximately 65 mm, the L-shaped barrier plates 208 may sufficiently block leakage of the process gas over the L-shaped barrier plates 208 while still enabling the gas deflector 152 to fit in a zone heater assembly 126 between the divider plate 148 and the gas exhaust 150 of the zone heater assembly 126. However, other values for the z-direction height of the L-shaped barrier plates 208, and ranges other than approximately 20 mm to approximately 65 mm, are within the scope of the present disclosure.

A width of a slot 206 (indicated in FIG. 2A as dimension D4), between the gas-permeating patterns 204a and 204b, may be included in a range of approximately 53 mm to approximately 64 mm to provide sufficient spacing between the gas-permeating patterns 204a and 204b. If the width of the slot 206 is less than approximately 53 mm or greater than approximately 64 mm, the spacing between the gas-permeating patterns 204a and 204b may result in reduced uniformity of gas flow velocity distribution and/or temperature distribution of the process gas across the single-layer plate 202. If the width of the slot 206 is included in the range of approximately 53 mm to approximately 64 mm, the spacing between the gas-permeating patterns 204a and 204b may promote uniformity of gas flow velocity distribution and/or temperature distribution of the process gas across the single-layer plate 202. However, other values for the width of the slot 206, and ranges other than approximately 53 mm to approximately 64 mm, are within the scope of the present disclosure.

FIG. 2B illustrates a detailed view of a gas-permeating pattern 204 (e.g., the gas-permeating patterns 204a and/or 204b) included in the single-layer plate 202 of the gas deflector 152. In some implementations, the gas-permeating pattern 204a includes the gas-permeating pattern 204 illustrated in FIG. 2B, and the gas-permeating pattern 204b includes a mirrored version of the gas-permeating pattern 204 illustrated in FIG. 2B.

As shown in FIG. 2B, the gas-permeating pattern 204 includes a plurality of groupings of holes 210, 212a-212d, 214a, and 214b that are included in the single-layer plate 202 of the gas deflector 152. The gas-permeating pattern 204 also includes slots 216a-216c extending in the x-direction. The gas-permeating pattern 204 also includes slots 218a-218d.

The holes 210 may be grouped around a center of the gas-permeating pattern 204 and may be spaced apart from each other. The holes 210 may have a circular shape. The holes 212a-212d may each be grouped in a semicircular arrangement (e.g., in a half-circle arrangement) around a first half of the holes 210. The holes 212a may be located adjacent to the first half of the holes 210, the holes 212b may be located adjacent to the holes 212a, the holes 212c may be located adjacent to the holes 212b, and the holes 212d may be located adjacent to the holes 212c. The holes 212a-212d may be arranged in increasing size, such that the diameter of the holes 212b is greater than the diameter of the holes 212a, the diameter of the holes 212c is greater than the diameter of the holes 212b, and the diameter of the holes 212d is greater than the diameter of the holes 212c. In some implementations, the diameter of the holes 210 is greater than the diameter of the holes 212c and less than the diameter of the holes 212d.

The holes 214a may be grouped at a first side 202a of the single-layer plate 202, and the holes 214b may be grouped at a second side 202a of the single-layer plate 202 opposing the first side. The holes 214a may extend along the first side 202a and along a portion of the slot 216b. The holes 214b may extend along the second side 202a and along another portion of the slot 216b. The holes 214a may be arranged in an asymmetric pattern as shown in FIG. 2B. The holes 214b may also be arranged in an asymmetric pattern as shown in FIG. 2B. Alternatively, the holes 214a and/or the holes 214b may be arranged in a symmetric pattern in the x-direction and/or in the y-direction. In some implementations, the diameter of the holes 214a is greater than the diameter of the holes 212a and less than the diameter of the holes 212b. In some implementations, the diameter of the holes 214b is greater than the diameter of the holes 212a and less than the diameter of the holes 212b. In some implementations, the diameter of the holes 214a and the diameter of the holes 214b are approximately equal. In some implementations, the diameter of the holes 214a is greater than the diameter of the holes 214b. In some implementations, the diameter of the holes 214a is less than the diameter of the holes 214b.

The slot 216a may be located on a first side of the gas-permeating pattern 204, and the slots 216b and 216c may be located on a second side of the gas-permeating pattern 204 opposing the first side. The holes 210, 212a-212d, 214a, and 214b, and the slots 218a-218d, may be located between the slot 216a and the slot 216b. The slot 216a may extend between the L-shaped barrier plates 208 at the corners of the single-layer plate 202.

The slot 216b and the slot 216c may be side by side in the gas-permeating pattern 204. The slots 216b and 216c may extend between the sides 202a of the single-layer plate 202. The slot 216c may be located next to the slot 206. The slots 216a-216c may each be approximately rectangular in shape and may each have approximately orthogonal or right-angled corners in a top view of the single-layer plate 202.

The slots 218a-218d may each have rounded ends (or rounded corners) and have a curved shape (e.g., an arc shape) in a top view of the single-layer plate 202. The slots 218a-218d may each be grouped in a semicircular arrangement (e.g., in a half-circle arrangement around a second half of the holes 210 opposing the first half. The slots 218a may be located adjacent to the second half of the holes 210, the slots 218b may be located adjacent to the slots 218a, the slots 218c may be located adjacent to the slots 218b, and the slots 218d may be located adjacent to the slots 218c. The semicircular arrangement of the slots 218a may abut the semicircular arrangement of the holes 212a. The semicircular arrangement of the slots 218b may abut the semicircular arrangement of the holes 212b. The semicircular arrangement of the slots 218c may abut the semicircular arrangement of the holes 212c. The semicircular arrangement of the slots 218d may abut the semicircular arrangement of the holes 212d.

The slots 218a-218d may be arranged in increasing size, such that a width of the slots 218b is greater than a width of the slots 218a, a width of the slots 218c is greater than the width of the slots 218b, and a width of the slots 218d is greater than the width of the slots 218c. In some implementations, a width of the slot 216a is greater than the width of the slots 218b and less than the width of the slots 218c. In some implementations, a width of the slot 216b is greater than the width of the slots 218c and less than the width of the slots 218d. In some implementations, a width of the slot 216c is greater than the width of the slots 218d and less than a width of the one or more slots 206.

A width of the slot 216a (indicated in FIG. 2B as dimension D5) may be included in a range of approximately 5.5 mm to approximately 6.6 mm to provide sufficient flow of the process gas through the single-layer plate 202. If the width of the slot 216a is less than approximately 5.5 mm or greater than approximately 6.6 mm, the flow of the process gas through the single-layer plate 202 may result in reduced uniformity of gas flow velocity distribution and/or temperature distribution of the process gas across the single-layer plate 202. If the width of the slot 216a is included in the range of approximately 5.5 mm to approximately 6.6 mm, the flow of the process gas through the single-layer plate 202 may promote uniformity of gas flow velocity distribution and/or temperature distribution of the process gas across the single-layer plate 202. However, other values for the width of the slot 216a, and ranges other than approximately 5.5 mm to approximately 6.6 mm, are within the scope of the present disclosure.

A width of the slot 216b (indicated in FIG. 2B as dimension D6) may be included in a range of approximately 6.7 mm to approximately 8.1 mm to provide sufficient flow of the process gas through the single-layer plate 202. If the width of the slot 216b is less than approximately 6.7 mm or greater than approximately 8.1 mm, the flow of the process gas through the single-layer plate 202 may result in reduced uniformity of gas flow velocity distribution and/or temperature distribution of the process gas across the single-layer plate 202. If the width of the slot 216b is included in the range of approximately 6.7 mm to approximately 8.1 mm, the flow of the process gas through the single-layer plate 202 may promote uniformity of gas flow velocity distribution and/or temperature distribution of the process gas across the single-layer plate 202. However, other values for the width of the slot 216b, and ranges other than approximately 6.7 mm to approximately 8.1 mm, are within the scope of the present disclosure.

A width of the slot 216c (indicated in FIG. 2B as dimension D7) may be included in a range of approximately 44 mm to approximately 53 mm to provide sufficient flow of the process gas through the single-layer plate 202. If the width of the slot 216c is less than approximately 44 mm or greater than approximately 53 mm, the flow of the process gas through the single-layer plate 202 may result in reduced uniformity of gas flow velocity distribution and/or temperature distribution of the process gas across the single-layer plate 202. If the width of the slot 216c is included in the range of approximately 4 mm to approximately 53 mm, the flow of the process gas through the single-layer plate 202 may promote uniformity of gas flow velocity distribution and/or temperature distribution of the process gas across the single-layer plate 202. However, other values for the width of the slot 216c, and ranges other than approximately 44 mm to approximately 53 mm, are within the scope of the present disclosure.

A width of the slots 218a (indicated in FIG. 2B as dimension D8) may be included in a range of approximately 2.9 mm to approximately 3.6 mm to provide sufficient flow of the process gas through the single-layer plate 202. If the width of the slots 218a is less than approximately 2.9 mm or greater than approximately 3.6 mm, the flow of the process gas through the single-layer plate 202 may result in reduced uniformity of gas flow velocity distribution and/or temperature distribution of the process gas across the single-layer plate 202. If the width of the slots 218a is included in the range of approximately 2.9 mm to approximately 3.6 mm, the flow of the process gas through the single-layer plate 202 may promote uniformity of gas flow velocity distribution and/or temperature distribution of the process gas across the single-layer plate 202. However, other values for the width of the slots 218a, and ranges other than approximately 2.9 mm to approximately 3.6 mm, are within the scope of the present disclosure.

A width of the slots 218b (indicated in FIG. 2B as dimension D9) may be included in a range of approximately 4.6 mm to approximately 5.6 mm to provide sufficient flow of the process gas through the single-layer plate 202. If the width of the slots 218b is less than approximately 4.6 mm or greater than approximately 5.6 mm, the flow of the process gas through the single-layer plate 202 may result in reduced uniformity of gas flow velocity distribution and/or temperature distribution of the process gas across the single-layer plate 202. If the width of the slots 218b is included in the range of approximately 4.6 mm to approximately 5.6 mm, the flow of the process gas through the single-layer plate 202 may promote uniformity of gas flow velocity distribution and/or temperature distribution of the process gas across the single-layer plate 202. However, other values for the width of the slots 218b, and ranges other than approximately 4.6 mm to approximately 5.6 mm, are within the scope of the present disclosure.

A width of the slots 218c (indicated in FIG. 2B as dimension D10) may be included in a range of approximately 6.3 mm to approximately 7.6 mm to provide sufficient flow of the process gas through the single-layer plate 202. If the width of the slots 218c is less than approximately 6.3 mm or greater than approximately 7.6 mm, the flow of the process gas through the single-layer plate 202 may result in reduced uniformity of gas flow velocity distribution and/or temperature distribution of the process gas across the single-layer plate 202. If the width of the slots 218c is included in the range of approximately 6.3 mm to approximately 7.6 mm, the flow of the process gas through the single-layer plate 202 may promote uniformity of gas flow velocity distribution and/or temperature distribution of the process gas across the single-layer plate 202. However, other values for the width of the slots 218c, and ranges other than approximately 6.3 mm to approximately 7.6 mm, are within the scope of the present disclosure.

A width of the slots 218d (indicated in FIG. 2B as dimension D11) may be included in a range of approximately 8.0 mm to approximately 9.6 mm to provide sufficient flow of the process gas through the single-layer plate 202. If the width of the slots 218d is less than approximately 8.0 mm or greater than approximately 9.6 mm, the flow of the process gas through the single-layer plate 202 may result in reduced uniformity of gas flow velocity distribution and/or temperature distribution of the process gas across the single-layer plate 202. If the width of the slots 218d is included in the range of approximately 8.0 mm to approximately 9.6 mm, the flow of the process gas through the single-layer plate 202 may promote uniformity of gas flow velocity distribution and/or temperature distribution of the process gas across the single-layer plate 202. However, other values for the width of the slots 218d, and ranges other than approximately 8.0 mm to approximately 9.6 mm, are within the scope of the present disclosure.

A diameter of the holes 210 (indicated in FIG. 2B as dimension D12) may be included in a range of approximately 7.1 mm to approximately 8.5 mm to provide sufficient flow of the process gas through the single-layer plate 202. If the diameter of the holes 210 is less than approximately 7.1 mm or greater than approximately 8.5 mm, the flow of the process gas through the single-layer plate 202 may result in reduced uniformity of gas flow velocity distribution and/or temperature distribution of the process gas across the single-layer plate 202. If the diameter of the holes 210 is included in the range of approximately 7.1 mm to approximately 8.5 mm, the flow of the process gas through the single-layer plate 202 may promote uniformity of gas flow velocity distribution and/or temperature distribution of the process gas across the single-layer plate 202. However, other values for the diameter of the holes 210, and ranges other than approximately 7.1 mm to approximately 8.5 mm, are within the scope of the present disclosure.

A diameter of the holes 212*a* (indicated in FIG. 2B as dimension D13) may be included in a range of approximately 2.9 mm to approximately 3.6 mm to provide sufficient flow of the process gas through the single-layer plate 202. If the diameter of the holes 212*a* is less than approximately 2.9 mm or greater than approximately 3.6 mm, the flow of the process gas through the single-layer plate 202 may result in reduced uniformity of gas flow velocity distribution and/or temperature distribution of the process gas across the single-layer plate 202. If the diameter of the holes 212*a* is included in the range of approximately 2.9 mm to approximately 3.6 mm, the flow of the process gas through the single-layer plate 202 may promote uniformity of gas flow velocity distribution and/or temperature distribution of the process gas across the single-layer plate 202. However, other values for the diameter of the holes 212*a*, and ranges other than approximately 2.9 mm to approximately 3.6 mm, are within the scope of the present disclosure.

A diameter of the holes 212*b* (indicated in FIG. 2B as dimension D14) may be included in a range of approximately 4.6 mm to approximately 5.6 mm to provide sufficient flow of the process gas through the single-layer plate 202. If the diameter of the holes 212*b* is less than approximately 4.6 mm or greater than approximately 5.6 mm, the flow of the process gas through the single-layer plate 202 may result in reduced uniformity of gas flow velocity distribution and/or temperature distribution of the process gas across the single-layer plate 202. If the diameter of the holes 212*b* is included in the range of approximately 4.6 mm to approximately 5.6 mm, the flow of the process gas through the single-layer plate 202 may promote uniformity of gas flow velocity distribution and/or temperature distribution of the process gas across the single-layer plate 202. However, other values for the diameter of the holes 212*b*, and ranges other than approximately 4.6 mm to approximately 5.6 mm, are within the scope of the present disclosure.

A diameter of the holes 212*c* (indicated in FIG. 2B as dimension D15) may be included in a range of approximately 6.3 mm to approximately 7.6 mm to provide sufficient flow of the process gas through the single-layer plate 202. If the diameter of the holes 212*c* is less than approximately 6.3 mm or greater than approximately 7.6 mm, the flow of the process gas through the single-layer plate 202 may result in reduced uniformity of gas flow velocity distribution and/or temperature distribution of the process gas across the single-layer plate 202. If the diameter of the holes 212*c* is included in the range of approximately 6.3 mm to approximately 7.6 mm, the flow of the process gas through the single-layer plate 202 may promote uniformity of gas flow velocity distribution and/or temperature distribution of the process gas across the single-layer plate 202. However, other values for the diameter of the holes 212*c*, and ranges other than approximately 6.3 mm to approximately 7.6 mm, are within the scope of the present disclosure.

A diameter of the holes 212*d* (indicated in FIG. 2B as dimension D16) may be included in a range of approximately 8.0 mm to approximately 9.6 mm to provide sufficient flow of the process gas through the single-layer plate 202. If the diameter of the holes 212*d* is less than approximately 8.0 mm or greater than approximately 9.6 mm, the flow of the process gas through the single-layer plate 202 may result in reduced uniformity of gas flow velocity distribution and/or temperature distribution of the process gas across the single-layer plate 202. If the diameter of the holes 212*d* is included in the range of approximately 8.0 mm to approximately 9.6 mm, the flow of the process gas through the single-layer plate 202 may promote uniformity of gas flow velocity distribution and/or temperature distribution of the process gas across the single-layer plate 202. However, other values for the diameter of the holes 212*d*, and ranges other than approximately 8.0 mm to approximately 9.6 mm, are within the scope of the present disclosure.

A diameter of the holes 214*a* (indicated in FIG. 2B as dimension D17) may be included in a range of approximately 3.8 mm to approximately 4.6 mm to provide sufficient flow of the process gas through the single-layer plate 202. If the diameter of the holes 214*a* is less than approximately 3.8 mm or greater than approximately 4.6 mm, the flow of the process gas through the single-layer plate 202 may result in reduced uniformity of gas flow velocity distribution and/or temperature distribution of the process gas across the single-layer plate 202. If the diameter of the holes 214*a* is included in the range of approximately 3.8 mm to approximately 4.6 mm, the flow of the process gas through the single-layer plate 202 may promote uniformity of gas flow velocity distribution and/or temperature distribution of the process gas across the single-layer plate 202. However, other values for the diameter of the holes 214*a*, and ranges other than approximately 3.8 mm to approximately 4.6 mm, are within the scope of the present disclosure.

A diameter of the holes 214*b* (indicated in FIG. 2B as dimension D18) may be included in a range of approximately 3.8 mm to approximately 4.6 mm to provide sufficient flow of the process gas through the single-layer plate 202. If the diameter of the holes 214*b* is less than approximately 3.8 mm or greater than approximately 4.6 mm, the flow of the process gas through the single-layer plate 202 may result in reduced uniformity of gas flow velocity distribution and/or temperature distribution of the process gas across the single-layer plate 202. If the diameter of the holes 214*b* is included in the range of approximately 3.8 mm to approximately 4.6 mm, the flow of the process gas through the single-layer plate 202 may promote uniformity of gas flow velocity distribution and/or temperature distribution of the process gas across the single-layer plate 202. However, other values for the diameter of the holes 214*b*, and ranges other than approximately 3.8 mm to approximately 4.6 mm, are within the scope of the present disclosure.

A spacing between the grouping of the holes 214*b* (or the grouping of the holes 214*a*) and the grouping of the slots 218*d* (indicated in FIG. 2B as dimension D19) may be less than approximately 110 mm to provide sufficient flow of the process gas through the single-layer plate 202. If the spacing between the grouping of the holes 214*b* and the grouping of the slots 218*d* is greater than approximately 110 mm, the flow of the process gas through the single-layer plate 202 may result in reduced uniformity of gas flow velocity distribution and/or temperature distribution of the process gas across the single-layer plate 202. If the spacing between the grouping of the holes 214*b* and the grouping of the slots 218*d* is less than approximately 110 mm, the flow of the process gas through the single-layer plate 202 may promote uniformity of gas flow velocity distribution and/or temperature distribution of the process gas across the single-layer plate 202. However, other values for the spacing between the grouping of the holes 214*b* and the grouping of the slots 218*d* are within the scope of the present disclosure.

A spacing between the grouping of the holes 214*a* and the grouping of the holes 214*b* (indicated in FIG. 2B as dimension D20) may be less than approximately 123 mm to provide sufficient flow of the process gas through the single-layer plate 202. If the spacing between the grouping of the holes 214*a* and the grouping of the holes 214*b* is greater than approximately 123 mm, the flow of the process gas through the single-layer plate 202 may result in reduced uniformity of gas flow velocity distribution and/or temperature distribution of the process gas across the single-layer plate 202. If the spacing between the grouping of the holes 214*a* and the grouping of the holes 214*b* is less than approximately 123 mm, the flow of the process gas through the single-layer plate 202 may promote uniformity of gas flow velocity distribution and/or temperature distribution of the process gas across the single-layer plate 202. However, other values for the spacing between the grouping of the holes 214*a* and the grouping of the holes 214*b* are within the scope of the present disclosure.

A density of the holes 210, 212*a*-212*b*, 214*a* and 214*b* in the gas-permeating pattern 204 may be included in a range of approximately 200 per square mm to approximately 80,000 per square mm to provide sufficient flow of the process gas through the single-layer plate 202. If the density of the holes 210, 212*a*-212*b*, 214*a* and 214*b* in the gas-permeating pattern 204 is less than approximately 200 per square mm or greater than approximately 80,000 per square mm, the flow of the process gas through the single-layer plate 202 may result in reduced uniformity of gas flow velocity distribution and/or temperature distribution of the process gas across the single-layer plate 202. If the density of the holes 210, 212*a*-212*b*, 214*a* and 214*b* in the gas-permeating pattern 204 is included in the range of approximately 200 per square mm to approximately 80,000 per square mm, the flow of the process gas through the single-layer plate 202 may promote uniformity of gas flow velocity distribution and/or temperature distribution of the process gas across the single-layer plate 202. However, other values for the density of the holes 210, 212*a*-212*b*, 214*a* and 214*b* in the gas-permeating pattern 204, and ranges other than approximately 200 per square mm to approximately 80,000 per square mm, are within the scope of the present disclosure.

As indicated above, FIGS. 2A and 2B are provided as an example. Other examples may differ from what is described with regard to FIGS. 2A and 2B.

FIGS. 3A-3D are diagrams of an example implementation 300 of a solder reflow operation described herein. The solder reflow operation is performed using the semiconductor processing tool 100 described herein. The solder reflow operation is performed to solder semiconductor components 106 onto a semiconductor package substrates 104 to form semiconductor device packages 102.

Figure 3A:
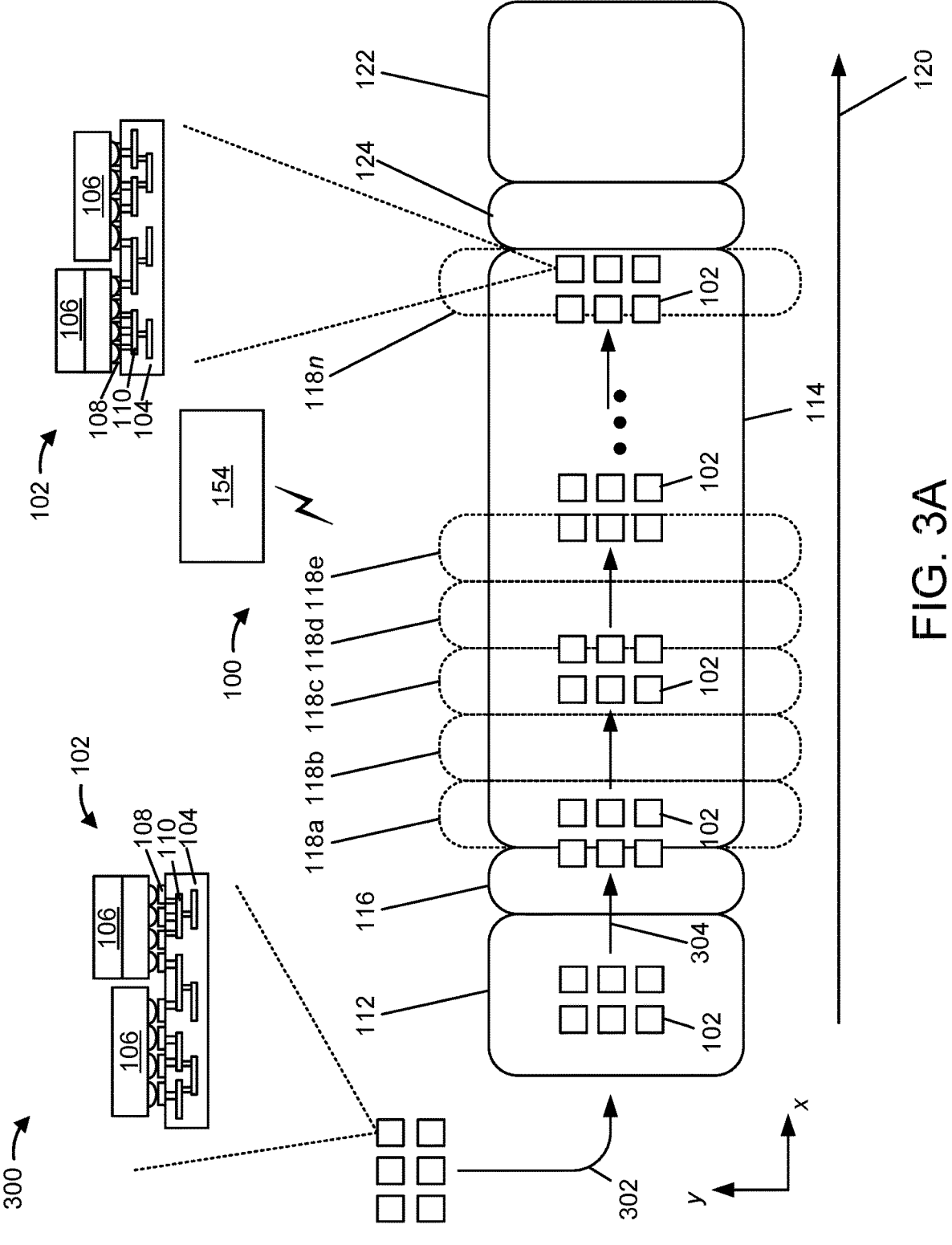
FIGS. 3A-3D are diagrams of an example implementation of a solder reflow operation described herein.

As shown in FIG. 3A, at 302, the semiconductor package substrates 104 (and in some cases, the associated semiconductor components 106) are provided to the conveyor device 114 through the load port 112 and through the buffer zone 116. The semiconductor package substrates 104 may be provided onto the conveyor device 114 using a transport tool. In some implementations, the controller 154 provides one or more signals to the transport tool to cause the transport tool to transfer the semiconductor package substrates 104 to the conveyor device 114.

At 304, the conveyor device 114 is used to move the semiconductor package substrate 104 through the plurality of heating zones 118*a*-118*n* to reflow the solder paste on the solder pads 108 between the semiconductor components 106 and the semiconductor package substrates 104 to bond the semiconductor components 106 to the semiconductor package substrates 104.

The controller 154 provides one or more signals to the conveyor device 114 to move the semiconductor device packages 102 through the heating zones 118*a*-118*n* along the direction of travel 120. Moreover, the controller 154 provides one or more signals to the zone heater assemblies 126*a*-126*n* to cause the heating elements 138 of the heater devices 136 to heat incoming ambient air based on respective temperature setpoints for each of the zone heater assemblies 126*a*-126*n*. The respective temperature setpoints may be based on the temperature profile for the semiconductor device packages 102. In some implementations, the controller 154 configures the respective temperature setpoints for each of the zone heater assemblies 126*a*-126*n* such that the temperature of the semiconductor device packages 102 is increased to a melting point of the solder paste on the solder pads 108 as the semiconductor device packages 102 are moved through one or more the heating zones 118*a*-118*n*. In some implementations, the controller 154 configures the respective temperature setpoints for each of the zone heater assemblies 126*a*-126*n* such that the temperature of the semiconductor device packages 102 is decreased from the melting point of the solder paste as the semiconductor device packages 102 are moved through the heating zone 118*a*-118*n*. This enables the semiconductor device packages 102 to gradually cool down after the solder paste is reflowed (as opposed to quickly ramping the temperature of the semiconductor device packages 102 down to room temperature), which may reduce the likelihood of cracking in the solder joints between the semiconductor components 106 and the solder pads 108.

Figure 3B:
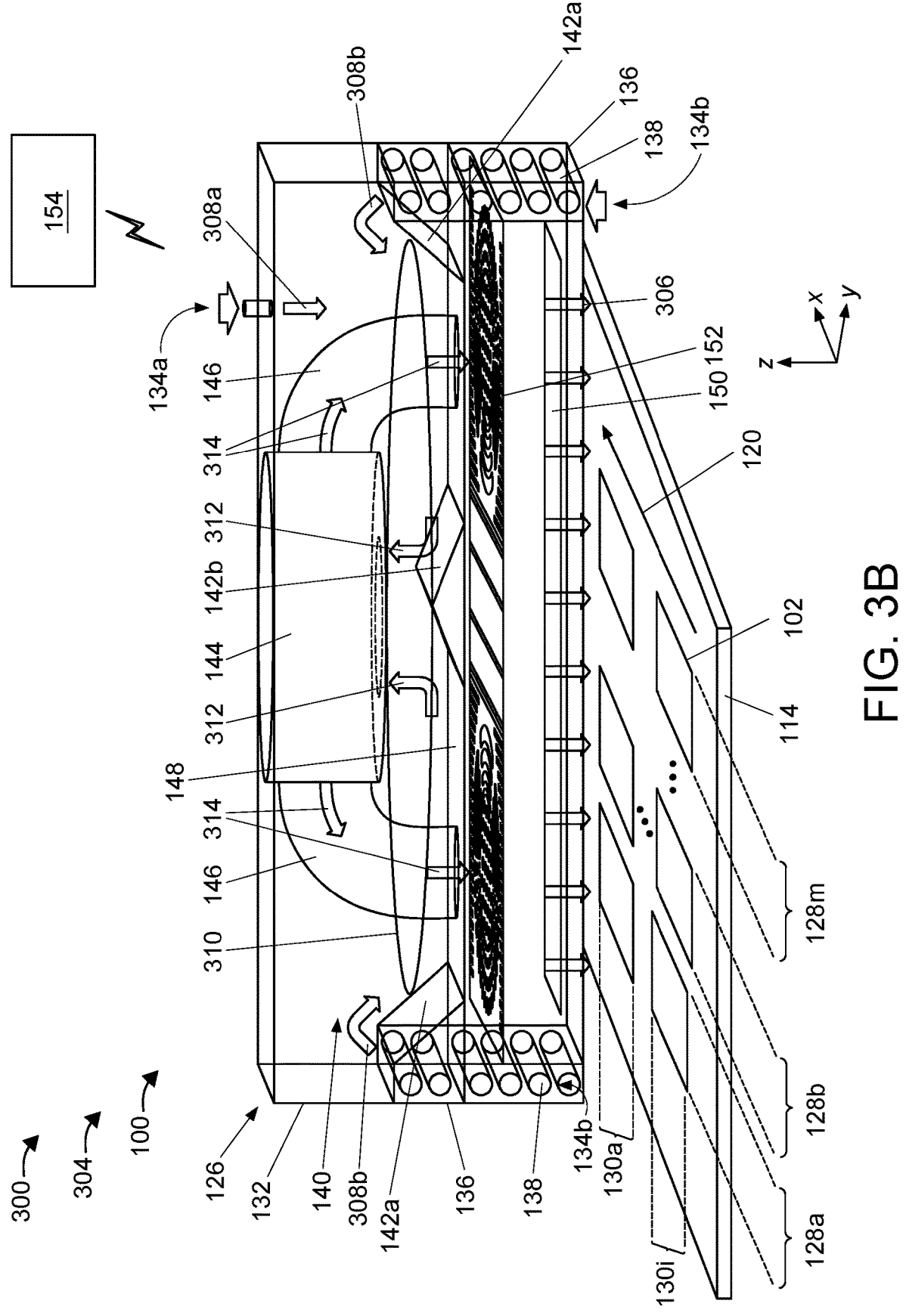

As shown in FIG. 3B, as part of heating semiconductor device packages 102 in a heating zone using a zone heater assembly 126 at 304, the controller 154 may provide one or more signals to the zone heater assembly 126 to cause the zone heater assembly 126 to generate a process gas 306 that is used to heat the semiconductor device packages 102. The process gas 306, which may include a mixture of one or more inlet gasses, is provided to the associated heating zone through the gas exhaust 150 of the zone heater assembly 126.

The one or more signals, provided by the controller 154, may cause the zone heater assembly 126 to receive an inert gas 308*a* through one or more inert gas inlets 134*a*, and to receive an ambient gas 308*b* through one or more ambient gas inlets 304*b*. The ambient gas 308*b* may be provided into a mixing chamber 140 of the zone heater assembly 126 through one or more heater devices 136. Heating elements 138 in the one or more heater devices 136 may heat (e.g., may increase the temperature of) the ambient gas 308*b* such that the temperature of the ambient gas 308*b* satisfies a temperature threshold associated with the temperature setpoint for the zone heater assembly 126.

The heated ambient gas 308*b* is then provided into the mixing chamber 140, where the heated ambient gas 308*b* mixes with the inert gas 308*a* in a mixing area 310 in the mixing chamber 140. The inert gas 308a and the heated ambient gas 308b are directed toward the mixing area 310 by one or more single-sided gas deflector shelves 142a at opposing ends of the mixing chamber 140. The mixing of the inert gas 308a and the heated ambient gas 308b in the mixing area 310 results in formation of the process gas 306.

At 310, a double-sided deflector shelf 142b at a center of the mixing chamber 140 directs the process gas 306 upward into a gas blower device 144, and the gas blower device 144 directs the process gas 306 through one or more gas outlets 146 at 314. The process gas 306 flows through the divider plate 148 and through the gas deflector 152 to the gas exhaust 150, and the process gas 306 is provided through the gas exhaust 150 to the heating zone associated with the zone heater assembly 126 to heat the semiconductor device packages 102 passing through the heating zone.

As further shown in FIG. 3B, the wafer/die transport tool may be used to arrange the semiconductor device packages 102 in a plurality of rows 130a-130i, on the conveyor device 114, that each include a plurality of semiconductor device packages 102. The conveyor device 114 is used to provide the rows 130a-130i of the semiconductor device packages 102 to be heated by each zone heater assembly 126. Each semiconductor device package 102, in a row of semiconductor device packages 102, is exposed to the process gas 314 in the associated heating zone at a same time. This increases the throughput of the semiconductor processing tool 100 and enables the semiconductor processing tool 100 to process a greater quantity of semiconductor device packages 102 in a time duration (e.g., a greater UPH) than if the semiconductor device packages 102 were processed one at a time.

Figure 3C:
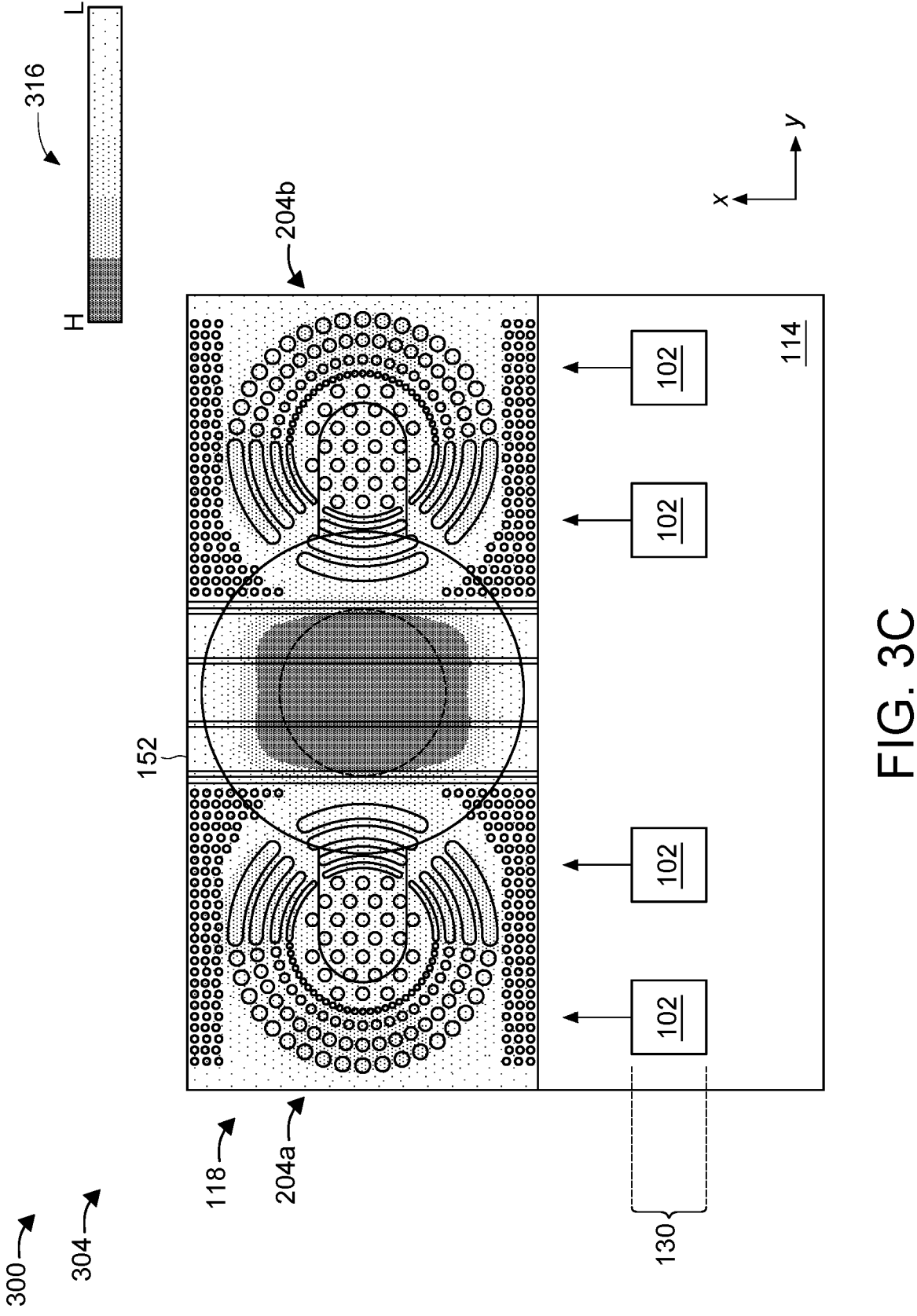

As shown in FIG. 3C, the gas deflector 152 described herein provides a uniform flow of the process gas 306 across the heating zone 118 associated with the zone heater assembly 126. The uniform flow of the process gas 306, provided by the gas deflector 152 described herein, enables rows 130 of a plurality of semiconductor device packages 102 to be processed in the heating zone 118 at the same time, which increases the throughput of the semiconductor processing tool 100. As shown in FIG. 3C, the horizontal flow field and temperature of the process gas 306 is substantially uniform across the x-y plane of the heating zone 118. This enables a greater quantity of semiconductor device packages 102 to be processed across the heating zone 118 at the same time than if another gas deflector were used. A row 130 of semiconductor device packages 102 may be positioned on the conveyor device 114 along the y-direction such that the semiconductor device packages 102 pass under the gas-permeating patterns 204a and 204b in the gas deflector 152. The gas-permeating patterns 204a and 204b in the gas deflector 152 promote uniformity of gas flow velocity and temperature of the process gas 306 across the x-y plane of the heating zone 118. FIG. 3C in particular illustrates a heat map of the heating zone 118, illustrating the uniformity of temperature 316 across the x-y plane of the heating zone 118.

In some implementations, the single-layer plate 202 of the gas deflector 152, the gas-permeating patterns 204a and 204b in the single-layer plate 202, and/or the barrier plates 208 at the corners of the single-layer plate 202 enable a low variation in gas flow velocity of the process gas 306 across the x-y plane of the heating zone 118. For example, the single-layer plate 202 of the gas deflector 152, and the gas-permeating patterns 204a and 204b in the single-layer plate 202 may enable a difference between a highest gas flow velocity of the process gas 306 and a lowest gas flow velocity of the process gas of approximately 3.5% or less to be achieved in the heating zone 118. As another example, the single-layer plate 202 of the gas deflector 152, and the gas-permeating patterns 204a and 204b in the single-layer plate 202 may enable a difference between a highest gas flow velocity of the process gas 306 and a lowest gas flow velocity of the process gas of approximately 0.15 meters per second (m/s) or less to be achieved in the heating zone 118. However, other values are within the scope of the present disclosure.

In some implementations, the single-layer plate 202 of the gas deflector 152, the gas-permeating patterns 204a and 204b in the single-layer plate 202, and/or the barrier plates 208 at the corners of the single-layer plate 202 enable a low variation in temperature of the process gas 306 across the x-y plane of the heating zone 118. For example, the single-layer plate 202 of the gas deflector 152, and the gas-permeating patterns 204a and 204b in the single-layer plate 202, may enable a difference between a highest temperature of the process gas 306 and a lowest temperature of the process gas of approximately 0.5% or less to be achieved in the heating zone 118. As another example, the single-layer plate 202 of the gas deflector 152, and the gas-permeating patterns 204a and 204b in the single-layer plate 202, may enable a difference between a highest temperature of the process gas 306 and a lowest temperature of the process gas of approximately 1.7 degrees Celsius or less to be achieved in the heating zone 118. However, other values are within the scope of the present disclosure.

Figure 3D:
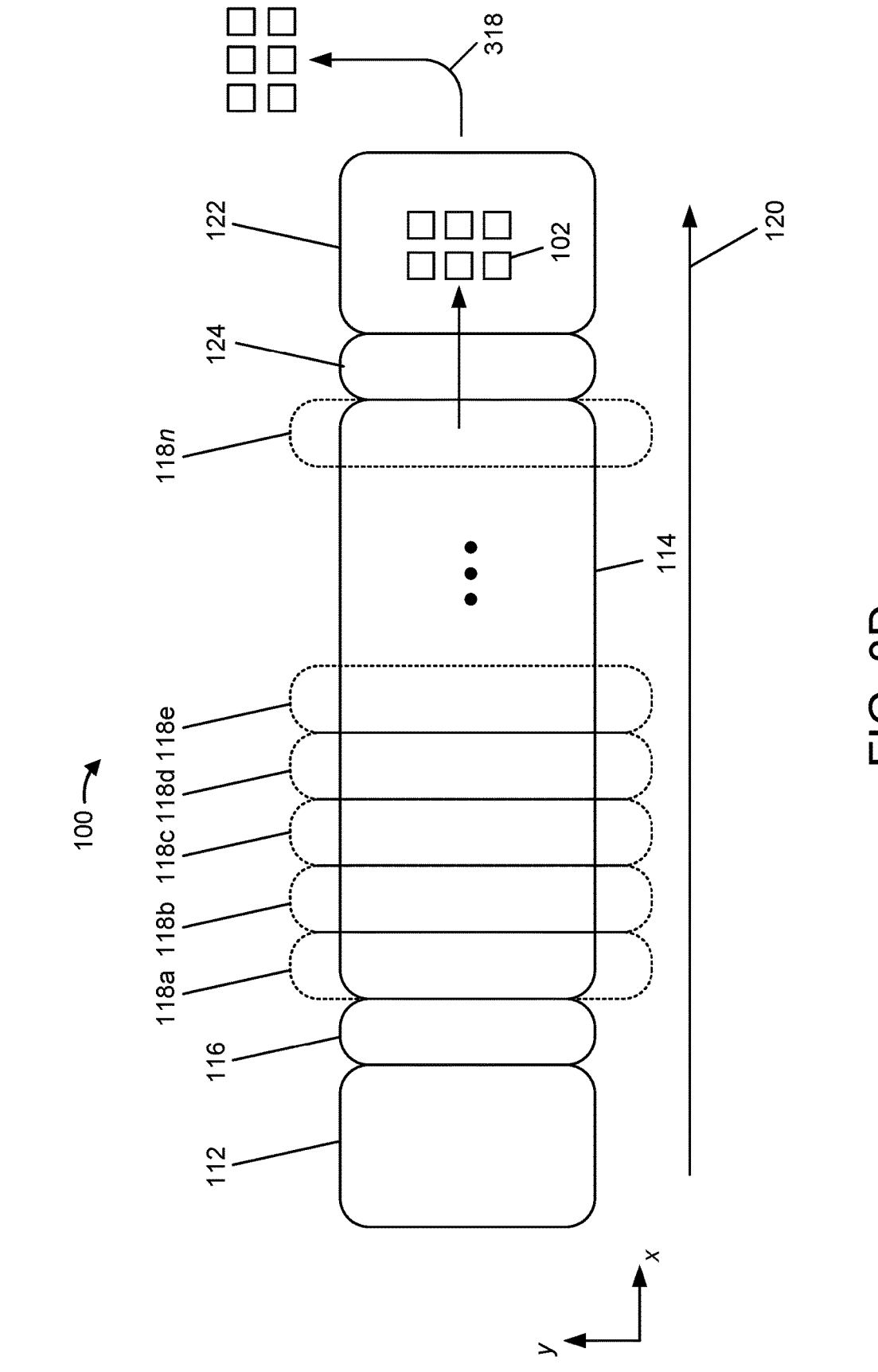

As shown in FIG. 3D, at the completion of the traversal of the semiconductor device packages 102 through the heating zones 118a-118n on the conveyor device 114, the semiconductor device packages 102 are transferred to the unload port 122 through the buffer zone 124, and then transferred out of the semiconductor processing tool 100. In some implementations, the semiconductor device packages 102 are transferred to the unload port 122, and then transferred out of the semiconductor processing tool 100 using a transport tool. In some implementations, the controller 154 provides one or more signals to the transport tool to cause the transport tool to transfer the semiconductor package substrates 104 to the unload port 122 and out of the semiconductor processing tool 100.

As indicated above, FIGS. 3A-3D are provided as an example. Other examples may differ from what is described with regard to FIGS. 3A-3D.

Figure 4:
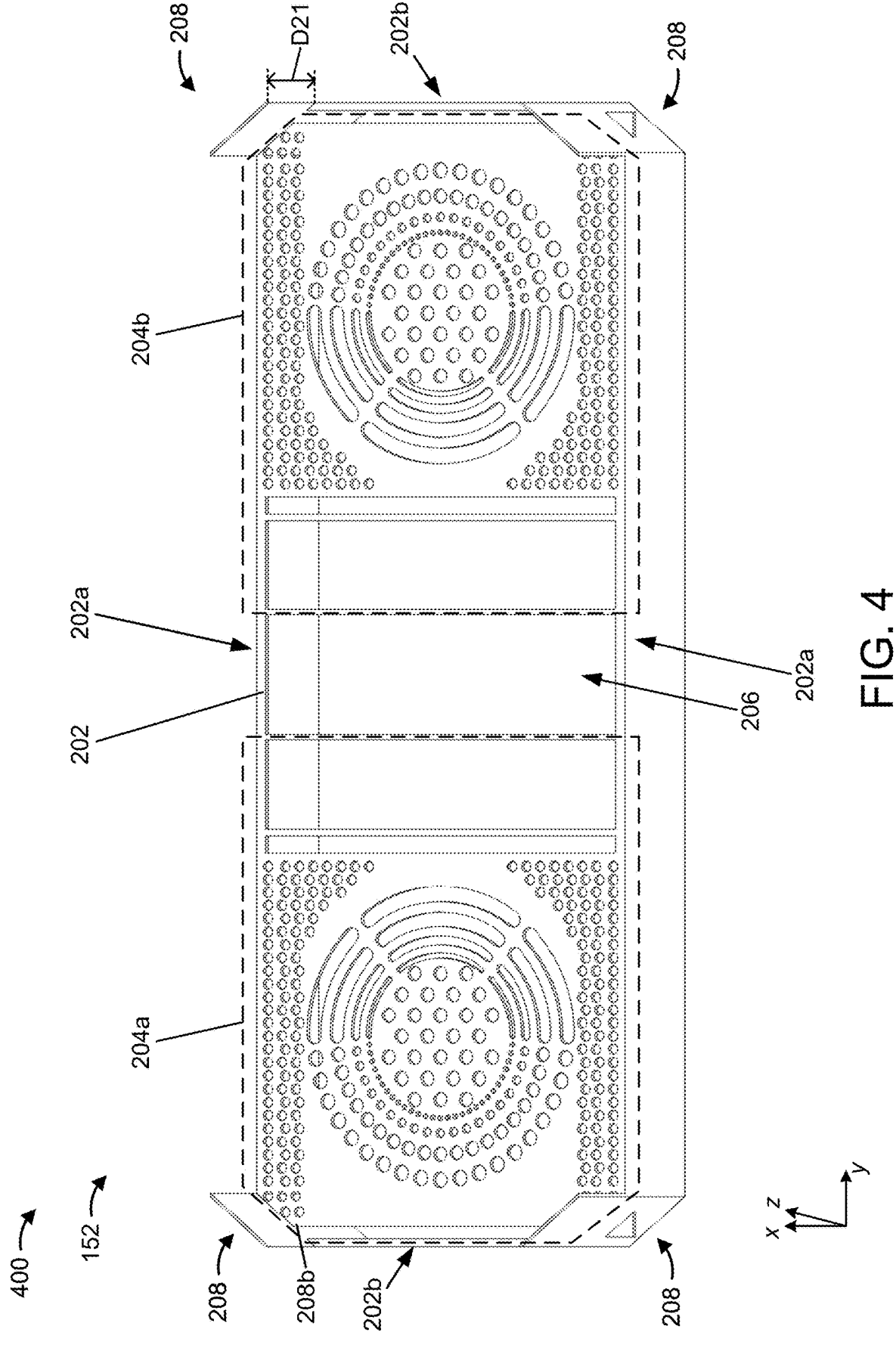
FIG. 4 is a diagram of an example gas deflector described herein for use in the semiconductor processing tool of FIGS. 1A and 1B.

FIG. 4 is a diagram of an example 400 of a gas deflector 152 described herein for use in the semiconductor processing tool 100 of FIGS. 1A and 1B. The example 400 of the gas deflector 152 is similar to the example 200 of the gas deflector 152, and includes a similar arrangement of components 202-218d. However, the example 400 of the gas deflector 152 includes angled barrier plates 208 at respective corners of the single-layer plate 202, as opposed to L-shaped barrier plates 208. The angled barrier plates 208 extend in a straight line between a side 202a and an end 202b of the single-layer plate 202. The angled barrier plates 208 also extend in the z-direction, which is orthogonal to the x-y plane in which the single-layer plate 202 of the gas deflector 152 is located. The angled barrier plates 208 may extend from the single-layer plate 202 to a z-direction height (indicated in FIG. 4 as dimension D21) that is included in a range of approximately 20 mm to approximately 65 mm. If the z-direction height of the angled barrier plates 208 is less than approximately 20 mm, the angled barrier plates 208 may not effectively block leakage of the process gas 306 over the angled barrier plates 208. If the z-direction height of the angled barrier plates 208 is greater than approximately 65 mm, the gas deflector 152 may not fit in a zone heater assembly 126 between the divider plate 148 and the gas exhaust 150 of the zone heater assembly 126. If the z-direction height of the angled barrier plates 208 is included in the range of approximately 20 mm to approximately 65 mm, the angled barrier plates 208 may sufficiently block leakage of the process gas 306 over the angled barrier plates 208 while still enabling the gas deflector 152 to fit in a zone heater assembly 126 between the divider plate 148 and the gas exhaust 150 of the zone heater assembly 126. However, other values for the z-direction height of the angled barrier plates 208, and ranges other than approximately 20 mm to approximately 65 mm, are within the scope of the present disclosure.

In some implementations, two or more of the zone heater assemblies 126a-126n include differently configured gas deflectors 152. For example, a zone heater assembly 126a may include a first gas deflector 152 having L-shaped barrier plates 208 (as shown in the example 200 of the gas deflector 152), and a second zone heater assembly 126b may include a second gas deflector 152 having angled barrier plates 208 (as shown in the example 400 of the gas deflector 152). As another example, a zone heater assembly 126a may include a first gas deflector 152 having barrier plates 208 that have a first z-direction height (e.g., a first dimension D3, a first dimension D21), and a zone heater assembly 126b may include a second gas deflector 152 having barrier plates 208 that have a second z-direction height (e.g., a second dimension D3, a second dimension D21) that is different from the first z-direction height.

As another example, a zone heater assembly 126a may include a first gas deflector 152 having a first set of gas-permeating patterns 204a and 204b, and a second zone heater assembly 126b may include a second gas deflector 152 having a second set of gas-permeating patterns 204a and 204b that is different from the first set of gas-permeating patterns 204a and 204b. For example, the first set of gas-permeating patterns 204a and 204b may include a first arrangement of holes 210, and the second set of gas-permeating patterns 204a and 204b may include a second arrangement of holes 210 that is different from the first arrangement of holes 210. As another example, the first set of gas-permeating patterns 204a and 204b may include a first arrangement of holes 212a-212d, and the second set of gas-permeating patterns 204a and 204b may include a second arrangement of holes 212a-212d that is different from the first arrangement of holes 212a-212d. As another example, the first set of gas-permeating patterns 204a and 204b may include a first arrangement of holes 214a and 214b, and the second set of gas-permeating patterns 204a and 204b may include a second arrangement of holes 214a and 214b that is different from the first arrangement of holes 214a and 214b. As another example, the first set of gas-permeating patterns 204a and 204b may include a first arrangement of slots 216a-216c, and the second set of gas-permeating patterns 204a and 204b may include a second arrangement of slots 216a-216c that is different from the first arrangement of slots 216a-216c. As another example, the first set of gas-permeating patterns 204a and 204b may include a first arrangement of slots 218a-218d, and the second set of gas-permeating patterns 204a and 204b may include a second arrangement of slots 218a-218d that is different from the first arrangement of slots 218a-218d.

In some implementations, a zone heater assembly 126 may include a gas deflector 152 having different configurations and/or different arrangements for the gas-permeating patterns 204a and 204b of the gas deflector 152. For example, the gas-permeating pattern 204a may include a first arrangement of holes 210, and the gas-permeating pattern 204b may include a second arrangement of holes 210 that is different from the first arrangement of holes 210. As another example, the gas-permeating pattern 204a may include a first arrangement of holes 212a-212d, and the gas-permeating pattern 204b may include a second arrangement of holes 212a-212d that is different from the first arrangement of holes 212a-212d. As another example, the gas-permeating pattern 204a may include a first arrangement of holes 214a and 214b, and the gas-permeating pattern 204b may include a second arrangement of holes 214a and 214b that is different from the first arrangement of holes 214a and 214b. As another example, the gas-permeating pattern 204a may include a first arrangement of slots 216a-216c, and the gas-permeating pattern 204b may include a second arrangement of slots 216a-216c that is different from the first arrangement of slots 216a-216c. As another example, the gas-permeating pattern 204a may include a first arrangement of slots 218a-218d, and the gas-permeating pattern 204b may include a second arrangement of slots 218a-218d that is different from the first arrangement of slots 218a-218d.

The configurations of gas deflectors 152 in a zone heater assembly 126 may be configured based on a temperature setpoint for the associated heating zone 118, may be based on a position of the zone heater assembly 126 in the arrangement of zone heater assemblies 126a-126n along the conveyor device 114, and/or may be based on another parameter.

As indicated above, FIG. 4 is provided as an example. Other examples may differ from what is described with regard to FIG. 4.

Figure 5:
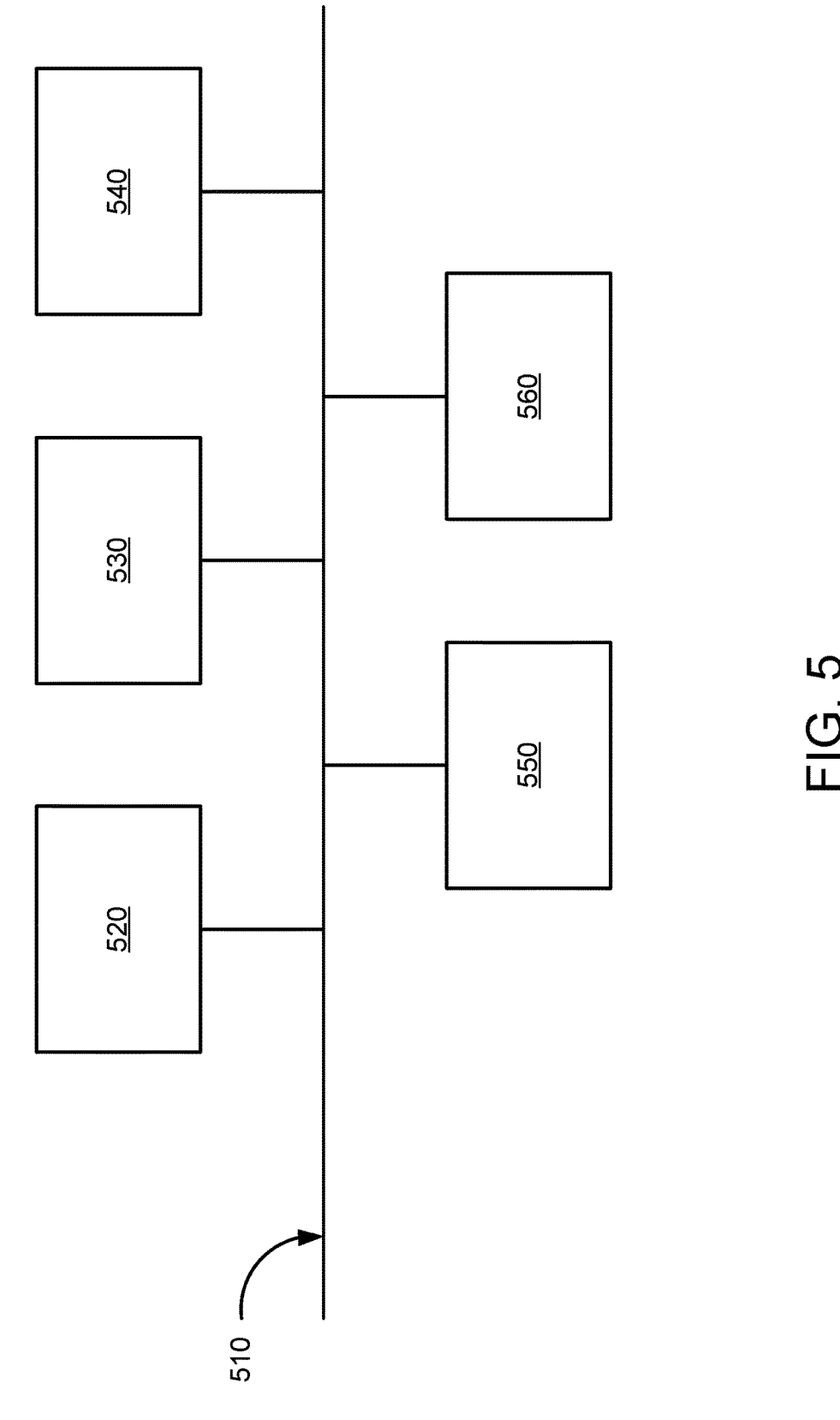
FIG. 5 is a diagram of example components of one or more devices described herein.

FIG. 5 is a diagram of example components of a device 500 described herein. The device 500 may correspond to the controller 154 and/or another device described herein. In some implementations, a zone heater assemblies 126a-126n, the controller 154, and/or another device of the semiconductor processing tool 100 may include one or more devices 500 and/or one or more components of the device 500. As shown in FIG. 5, the device 500 may include a bus 510, a processor 520, a memory 530, an input component 540, an output component 550, and/or a communication component 560.

The bus 510 may include one or more components that enable wired and/or wireless communication among the components of the device 500. The bus 510 may couple together two or more components of FIG. 5, such as via operative coupling, communicative coupling, electronic coupling, and/or electric coupling. For example, the bus 510 may include an electrical connection (e.g., a wire, a trace, and/or a lead) and/or a wireless bus. The processor 520 may include a central processing unit, a graphics processing unit, a microprocessor, a controller, a microcontroller, a digital signal processor, a field-programmable gate array, an application-specific integrated circuit, and/or another type of processing component. The processor 520 may be implemented in hardware, firmware, or a combination of hardware and software. In some implementations, the processor 520 may include one or more processors capable of being programmed to perform one or more operations or processes described elsewhere herein.

The memory 530 may include volatile and/or nonvolatile memory. For example, the memory 530 may include random access memory (RAM), read only memory (ROM), a hard disk drive, and/or another type of memory (e.g., a flash memory, a magnetic memory, and/or an optical memory). The memory 530 may include internal memory (e.g., RAM, ROM, or a hard disk drive) and/or removable memory (e.g., removable via a universal serial bus connection). The memory 530 may be a non-transitory computer-readable medium. The memory 530 may store information, one or more instructions, and/or software (e.g., one or more software applications) related to the operation of the device 500. In some implementations, the memory 530 may include one or more memories that are coupled (e.g., communicatively coupled) to one or more processors (e.g., processor 520), such as via the bus 510. Communicative coupling between a processor 520 and a memory 530 may enable the processor 520 to read and/or process information stored in the memory 530 and/or to store information in the memory 530.

The input component 540 may enable the device 500 to receive input, such as user input and/or sensed input. For example, the input component 540 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 550 may enable the device 500 to provide output, such as via a display, a speaker, and/or a light-emitting diode. The communication component 560 may enable the device 500 to communicate with other devices via a wired connection and/or a wireless connection. For example, the communication component 560 may include a receiver, a transmitter, a transceiver, a modem, a network interface card, and/or an antenna.

The device 500 may perform one or more operations or processes described herein. For example, a non-transitory computer-readable medium (e.g., memory 530) may store a set of instructions (e.g., one or more instructions or code) for execution by the processor 520. The processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hard-wired circuitry may be used instead of or in combination with the instructions to perform one or more operations or processes described herein. Additionally, or alternatively, the processor 520 may be configured to perform one or more operations or processes described herein. Thus, implementations described herein are not limited to any specific combination of hardware circuitry and software.

The number and arrangement of components shown in FIG. 5 are provided as an example. The device 500 may include additional components, fewer components, different components, or differently arranged components than those shown in FIG. 5. Additionally, or alternatively, a set of components (e.g., one or more components) of the device 500 may perform one or more functions described as being performed by another set of components of the device 500.

FIG. 6 is a flowchart of an example process 600 associated with a solder reflow operation described herein. The solder reflow operation may be performed to bond one or more semiconductor components 106 to a semiconductor package substrate 104 of one or more semiconductor device packages 102. In some implementations, one or more process blocks of FIG. 6 are performed by a reflow solder tool (e.g., the semiconductor processing tool 100). In some implementations, one or more process blocks of FIG. 6 are performed by another device or a group of devices separate from or including the reflow solder tool, such as a zone heater assembly (e.g., a zone heater assembly 126), a controller (e.g., a controller 154), and/or a transport tool, among other examples. Additionally, or alternatively, one or more process blocks of FIG. 6 may be performed by one or more components of device 500, such as processor 520, memory 530, input component 540, output component 550, and/or communication component 560.

As shown in FIG. 6, process 600 may include providing a plurality of semiconductor package substrates onto a conveyor device of a reflow solder tool (block 610). For example, a transport tool may be used to provide a plurality of semiconductor package substrates 104 onto a conveyor device 114 of the reflow solder tool (e.g., the semiconductor processing tool 100), as described herein.

As further shown in FIG. 6, process 600 may include providing, using the conveyor device, the plurality of semiconductor package substrates to a heating zone of the reflow solder tool (block 620). For example, the reflow solder tool (e.g., the semiconductor processing tool 100) may be used to provide, using the conveyor device 114, the plurality of semiconductor package substrates 104 to a heating zone 118 (e.g., a heating zone 118*a*-118*n*) of the reflow solder tool, as described herein.

As further shown in FIG. 6, process 600 may include bonding one or more semiconductor components to each of the plurality of semiconductor package substrates using a process gas that is provided to the heating zone, wherein the process gas is provided to the heating zone using a zone heater assembly that comprises a single-layer gas deflector (block 630). For example, the reflow solder tool (e.g., the semiconductor processing tool 100) may be used to bond one or more semiconductor components 106 to each of the plurality of semiconductor package substrates 104 using a process gas 306 that is provided to the heating zone 118, as described herein. In some implementations, the process gas 306 is provided to the heating zone 118 using a zone heater assembly 126 (e.g., a zone heater assembly 126*a*-126*n*) that includes a single-layer gas deflector (e.g., a gas deflector 152 including a single-layer plate 202).

Process 600 may include additional implementations, such as any single implementation or any combination of implementations described below and/or in connection with one or more other processes described elsewhere herein.

In a first implementation, process 600 includes providing the process gas 306 through a gas exhaust 150 of the zone heater assembly 126, where the process gas 306 is provided to the gas exhaust 150 through the single-layer gas deflector (e.g., the gas deflector 152 including the single-layer plate 202)

In a second implementation, alone or in combination with the first implementation, the process gas 306 is provided to the gas exhaust 150 through a first gas-permeating pattern 204*a* in the single-layer plate 202 of the gas deflector 152, and through a second gas-permeating pattern 204*b* in the single-layer plate 202 of the gas deflector 152.

In a third implementation, alone or in combination with one or more of the first and second implementations, providing the plurality of semiconductor package substrates 104 onto the conveyor device 114 of the reflow solder tool (e.g., the semiconductor processing tool 100) includes arranging the plurality of semiconductor package substrates 104 in a plurality of rows 130*a*-130*i* of semiconductor package substrates 104 on the conveyor device 114, where each row 130 of semiconductor package substrates 104, of the plurality of rows 130*a*-130*i* of semiconductor package substrates 104, includes two or more of the plurality of semiconductor package substrates 104, and where providing the plurality of semiconductor package substrates 104 to the heating zone 118 includes providing a row 130 of semiconductor package substrates 104, of the plurality of rows 130*a*-130*i* of semiconductor package substrates 104, to the heating zone 118, where each semiconductor package substrate 104, in the row 130 of semiconductor package substrates 104, is exposed to the process gas 306 in the heating zone 118 at a same time.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

In this way, a zone heater assembly of a reflow solder tool includes a gas deflector having a single-layer structure. The single-layer structure may include one or more gas-permeating patterns through which a process gas is to flow from one or more gas outlets to a gas exhaust of the zone heater assembly. The one or more gas-permeating patterns in the single-layer structure promote uniformity of gas flow through the gas exhaust and into a heating zone of the reflow solder tool. The uniformity of the gas flow of the process gas enables convection heat provided by the process gas to be uniformly distributed across the heating zone. In this way, the gas deflector described herein may decrease hot spots and/or cold spots in the heating zone, which enables greater flexibility in placement of semiconductor package substrates on a conveyor device of the reflow solder tool. This enables a greater quantity and/or rate of semiconductor package substrates to be processed using the reflow solder tool than without the gas deflector, which increases the productivity (e.g., the UPH) of the reflow solder tool. Moreover, the increased temperature uniformity in the heating zone increases the likelihood that sufficient convection heat is provided to the semiconductor package substrates on the conveyor device to form high-quality solder joints between the semiconductor package substrates and the components bonded to the semiconductor package substrates. This decreases the likelihood that the solder joints will fail, which may result in a reduced failure rate in the bonds between the components on the semiconductor package substrates, and/or may increase the yield of semiconductor device packages produced by the reflow solder tool.

As described in greater detail above, some implementations described herein provide a gas deflector for use in a reflow solder tool. The gas deflector includes a single-layer plate. The gas deflector includes a gas-permeating pattern in the single-layer plate, where the gas-permeating pattern includes a plurality of holes spaced apart from each other, and a plurality of slots spaced apart from each other.

As described in greater detail above, some implementations described herein provide a reflow solder tool. The reflow solder tool includes a conveyer device configured to provide semiconductor package substrates to a heating zone. The reflow solder tool includes a zone heater assembly configured to provide a process gas to the heating zone, where the zone heater assembly includes one or more gas outlets, a gas exhaust, and a single-layer gas deflector between the gas exhaust and the one or more gas outlets.

As described in greater detail above, some implementations described herein provide a method. The method includes providing a plurality of semiconductor package substrates onto a conveyor device of a reflow solder tool. The method includes providing, using the conveyor device, the plurality of semiconductor package substrates to a heating zone of the reflow solder tool. The method includes bonding one or more semiconductor components to each of the plurality of semiconductor package substrates using a process gas that is provided to the heating zone, where the process gas is provided to the heating zone using a zone heater assembly that includes a single-layer gas deflector.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

When "a processor" or "one or more processors" (or another device or component, such as "a controller" or "one or more controllers") is described or claimed (within a single claim or across multiple claims) as performing multiple operations or being configured to perform multiple operations, this language is intended to broadly cover a variety of processor architectures and environments. For example, unless explicitly claimed otherwise (e.g., via the use of "first processor" and "second processor" or other language that differentiates processors in the claims), this language is intended to cover a single processor performing or being configured to perform all of the operations, a group of processors collectively performing or being configured to perform all of the operations, a first processor performing or being configured to perform a first operation and a second processor performing or being configured to perform a second operation, or any combination of processors performing or being configured to perform the operations. For example, when a claim has the form "one or more processors configured to: perform X; perform Y; and perform Z," that claim should be interpreted to mean "one or more processors configured to perform X; one or more (possibly different) processors configured to perform Y; and one or more (also possibly different) processors configured to perform Z."

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gas deflector for use in a reflow solder tool, the gas deflector comprising:

a single-layer plate; and a gas-permeating pattern in the single-layer plate, wherein the gas-permeating pattern comprises:

a plurality of holes spaced apart from each other, and a plurality of slots spaced apart from each other, wherein each of the plurality of slots have a curved top surface and a curved bottom surface, and wherein at least one of:

a first subset of slots, of the plurality of slots, circumscribes a first subset of holes of the plurality of holes, or a second subset of slots, of the plurality of slots, forms a circle with a second subset of holes of the plurality of holes.

2. The gas deflector of claim 1, wherein the gas-permeating pattern is a first gas-permeating pattern in the single-layer plate, wherein the gas deflector further comprises:

a second gas-permeating pattern in the single-layer plate.

3. The gas deflector of claim 2, further comprising:

one or more slots, in the single-layer plate, between the first gas-permeating pattern and the second gas-permeating pattern.

4. The gas deflector of claim 3, wherein the plurality of slots have a curved shape in a top view of the single-layer plate, and wherein the one or more slots have a rectangular shape in the top view of the single-layer plate.

5. The gas deflector of claim 3, wherein the plurality of slots have rounded ends in a top view of the single-layer plate, and wherein the one or more slots have ends that are approximately orthogonal to sides of the one or more slots in the top view of the single-layer plate.

6. The gas deflector of claim 2, wherein the plurality of holes is a first plurality of holes, wherein the plurality of slots is a first plurality of slots, and wherein the second gas-permeating pattern comprises:

a second plurality of holes spaced apart from each other, and a second plurality of slots spaced apart from each other.

7. The gas deflector of claim 6, wherein an arrangement of the first plurality of holes in the first gas-permeating pattern and an arrangement of the second plurality of holes in the second gas-permeating pattern are different arrangements.

8. The gas deflector of claim 6, wherein an arrangement of the first plurality of slots in the first gas-permeating pattern and an arrangement of the second plurality of slots in the second gas-permeating pattern are different arrangements.

9. A gas deflector, comprising:

a single-layer plate;

a plurality of gas-permeating patterns in the single-layer plate;

a single slot, between the plurality of gas-permeating patterns, extending along an entire length of the plurality of gas-permeating patterns; and a plurality of L-shaped barrier plates attached to the single-layer plate.

10. The gas deflector of claim 9, wherein the single slot is located approximately in a center of the single-layer plate and extends between sides of the single-layer plate.

11. The gas deflector of claim 9, wherein the plurality of L-shaped barrier plates are located at respective corners of the single-layer plate.

12. The gas deflector of claim 9, wherein an L-Shaped barrier plate, of the plurality of L-shaped barrier plates, includes a first segment, extending in an x-direction, and a second segment extending in a y-direction.

13. The gas deflector of claim 12, wherein at least one of the first segment or the second segment has a length that is included in a range of greater than 0 millimeters (mm) to approximately 27 mm.

14. The gas deflector of claim 9, wherein an L-Shaped barrier plate, of the plurality of L-shaped barrier plates, extends in a z-direction that is orthogonal to an x-y plane in which the single-layer plate is located.

15. The gas deflector of claim 9, wherein each of the plurality of gas-permeating patterns comprises:

a plurality of holes spaced apart from each other, and a plurality of slots spaced apart from each other.

16. The gas deflector of claim 9, wherein the plurality of gas-permeating patterns includes a first gas-permeating pattern and a second gas-permeating pattern mirroring the first gas-permeating pattern.

17. The gas deflector of claim 9, wherein a width of the single slot is included in a range of 53 millimeters (mm) to approximately 64 mm.

18. A gas deflector, comprising:

a single-layer plate;

a first gas-permeating pattern, in the single-layer plate, comprising:

first holes arranged in a circular shape, second holes arranged in a semicircular arrangement and adjacent to a first subset of the first holes, third holes arranged in an asymmetric pattern in an x-direction and a y-direction, and slots, having a curved top surface and a curved bottom surface, around a second subset of the first holes; and a second gas-permeating pattern, in the single-layer plate, that is a mirrored version of the first gas-permeating pattern.

19. The gas deflector of claim 9, wherein the plurality of gas-permeating patterns includes:

a first arrangement of holes, and a second arrangement of holes.

20. The gas deflector of claim 18, wherein at least one of:

the second holes are of different sizes, of the slots are of different sizes.

* * * * *